(12) United States Patent
Coteus et al.

(10) Patent No.: US 7,948,817 B2
(45) Date of Patent: May 24, 2011

(54) ADVANCED MEMORY DEVICE HAVING REDUCED POWER AND IMPROVED PERFORMANCE

(75) Inventors: Paul W. Coteus, Yorktown, NY (US); Daniel M. Dreps, Georgetown, TX (US); Kevin C. Gower, LeGrangeville, NY (US); Hillery C. Hunter, Chappaqua, NY (US); Charles A. Kilmer, Essex Junction, VT (US); Kyu-hyoun Kim, Mount Kisco, NY (US); Kenneth L. Wright, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 107 days.

(21) Appl. No.: 12/394,804

(22) Filed: Feb. 27, 2009

(65) Prior Publication Data
US 2010/0220536 A1 Sep. 2, 2010

(51) Int. Cl.
*G11C 7/00* (2006.01)
(52) U.S. Cl. ..................................... 365/194; 365/233.1

(58) Field of Classification Search .................. 365/194, 365/233.1
See application file for complete search history.

(56) References Cited

U.S. PATENT DOCUMENTS

| 6,212,127 | B1 * | 4/2001 | Funaba et al. | 365/233.12 |
| 6,980,042 | B2 * | 12/2005 | LaBerge | 327/291 |
| 2003/0067332 | A1 * | 4/2003 | Mikhalev et al. | 327/158 |

* cited by examiner

*Primary Examiner* — Huan Hoang
(74) *Attorney, Agent, or Firm* — Cantor Colburn LLP; Daniel Morris

(57) ABSTRACT

A memory device including a memory array storing data, a variable delay controller, a passive variable delay circuit and an output driver. The variable delay controller periodically receives delay commands from a first source external to the memory device during operation of the memory device, and outputs delay instruction bits responsive to the received delay commands. The passive variable delay circuit receives a clock from a second source external to the memory device, receives the delay instruction bits from the variable delay controller, generates a delayed clock having a time relation to the received clock as determined by the delay instruction bits, and outputting the delayed clock. The output driver receives the data from the memory array and the delayed clock, and outputs the data at a time responsive to the delayed clock.

6 Claims, 47 Drawing Sheets

| Function | | CKE | CMD pins | ADDR pins |
|---|---|---|---|---|
| Power down | Entry | H→L | LHHH (no operation) | don't care |
| | Exit | L→H | LHHH (no operation) | don't care |
| Self refresh | Entry | H→L | LLLH (refresh) | don't care |
| | Exit | L→H | LHHH (no operation) | don't care |
| Refresh | | keep 'H' | LLLH | don't care |
| Calibration | | keep 'H' | LHHL | don't care |
| Mode register set | | keep 'H' | LLLL | valid address |
| Activation | | keep 'H' | LLHH | valid address |
| Precharge | | keep 'H' | LLHL | valid address |
| Read | | keep 'H' | LHLH | valid address |
| Write | | keep 'H' | LHLL | valid address |
| No operation | | keep 'H' | LHHH | don't care |
| Deselect (=no operation) | | keep 'H' | HXXX | don't care |

FIG. 33

| Function | | CKE | CMD pins | ADDR pins | symbol |
|---|---|---|---|---|---|
| Power down from/to idle | Entry | H→H→L→L | LHHH (no operation) | don't care | a |
| | Exit | L→H→H | LHHH (no operation) | don't care | b |
| Self refresh from/to idle | Entry | H→H→L→L | LLLH (refresh) | don't care | c |
| | Exit | L→H→H | LHHH (no operation) | don't care | d |
| Power down→Self refresh | | L→H→L→H→L | XXXX | don't care | e |
| Self refresh→Power down | | L→H→L→H→L | XXXX | don't care | f |
| Refresh | at idle | keep 'H' | LLLH | don't care | g |
| | at PD | L→H→L→L→H→L | XXXX | don't care | h |
| Calibration | at idle | keep 'H' | LHHL | don't care | i |
| | at PD or SR | L→H→L→L→L→H→L | XXXX | don't care | j |
| Mode register set | | keep 'H' | LLLL | valid address | |
| Activation | | keep 'H' | LLHH | valid address | |
| Precharge | | keep 'H' | LLHL | valid address | |
| Read | | keep 'H' | LHLH | valid address | |
| Write | | keep 'H' | LHLL | valid address | |
| No operation | | keep 'H' | LHHH | don't care | |
| Deselect (=no operation) | | keep 'H' | HXXX | don't care | |

FIG. 35

ADVANCED MEMORY DEVICE HAVING REDUCED POWER AND IMPROVED PERFORMANCE

BACKGROUND

This invention relates generally to memory within a computing environment, and more particularly to memory devices.

Overall computer system performance is affected by each of the key elements of the computer structure, including the performance/structure of the processor(s), any memory cache (s), the input/output (I/O) subsystem(s), the efficiency of the memory control function(s), the main memory device(s), and the type and structure of the interconnect interface(s).

Extensive research and development efforts are invested by the industry, on an ongoing basis, to create improved and/or innovative solutions to maximizing overall computer system performance and density by improving the system/subsystem design and/or structure. High-availability systems present further challenges as related to overall system reliability due to customer expectations that new computer systems will markedly surpass existing systems in regard to mean-time-between-failure (MTBF), in addition to offering additional functions, increased performance, increased storage, lower operating costs, etc. Other frequent customer requirements further exacerbate the computer system design challenges, and include such items as ease of upgrade and reduced system environmental impact (such as space, power, and cooling).

BRIEF SUMMARY

An exemplary embodiment of the present invention includes a memory device including a memory array storing data, a variable delay controller, a passive variable delay circuit and an output driver. The variable delay controller periodically receives delay commands from a first source external to the memory device during operation of the memory device, and outputs delay instruction bits responsive to the received delay commands. The passive variable delay circuit receives a clock from a second source external to the memory device, receives the delay instruction bits from the variable delay controller, generates a delayed clock having a time relation to the received clock as determined by the delay instruction bits, and outputs the delayed clock. The output driver receives the data from the memory array and the delayed clock, and outputs the data at a time responsive to the delayed clock.

Another exemplary embodiment is a method for receiving data. The method includes receiving a clock signal at a receiving device, the clock signal having a clock frequency. The method also includes receiving a command at the receiving device. The received command is latched in response to one or more of a rising edge and a falling edge of the clock signal. A burst of date is received at the received device from a transmitting device via a data bus. The burst of data includes first data and second data. A data strobe signal driven by the transmitting device is received at the receiving device. The strobe is in a preamble state prior to reaching a stable switching state. The first data is captured at a first data rate that is less than or equal to the clock frequency. The capturing the first data is responsive to the data strobe while the data strobe is in the preamble state. The second data is captured at a second data rate that is faster than the clock frequency. The capturing the second data is responsive to the data strobe while the data strobe is in the stable switching state.

A further exemplary embodiment includes a memory device including a physical memory array, row decoder circuitry, and activation circuitry. The physical memory array includes memory cells that are arranged in addressable rows and columns. The physical memory array is subdivided into a plurality of logical memory arrays with each addressable row in the physical memory array spanning the logical memory arrays such that different portions of each addressable row are included in each of the logical memory arrays. The row decoder circuitry is connected to the physical memory array and shared between the logical memory arrays. The row decoder circuitry receives a row address specifying a physical row and a logical memory array. The activation circuitry is connected to the physical memory array and the row decoder circuitry. The activation circuitry activates a subset of the specified physical row that includes the specified logical memory array.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE SEVERAL VIEWS OF THE DRAWINGS

Referring now to the drawings wherein like elements are numbered alike in the several FIGURES:

FIG. 33 depicts a command truth table corresponding to the state diagram in FIG. 32;

FIG. 35 depicts a command truth table corresponding to the state diagram in FIG. 34;

DETAILED DESCRIPTION

Figure 1:
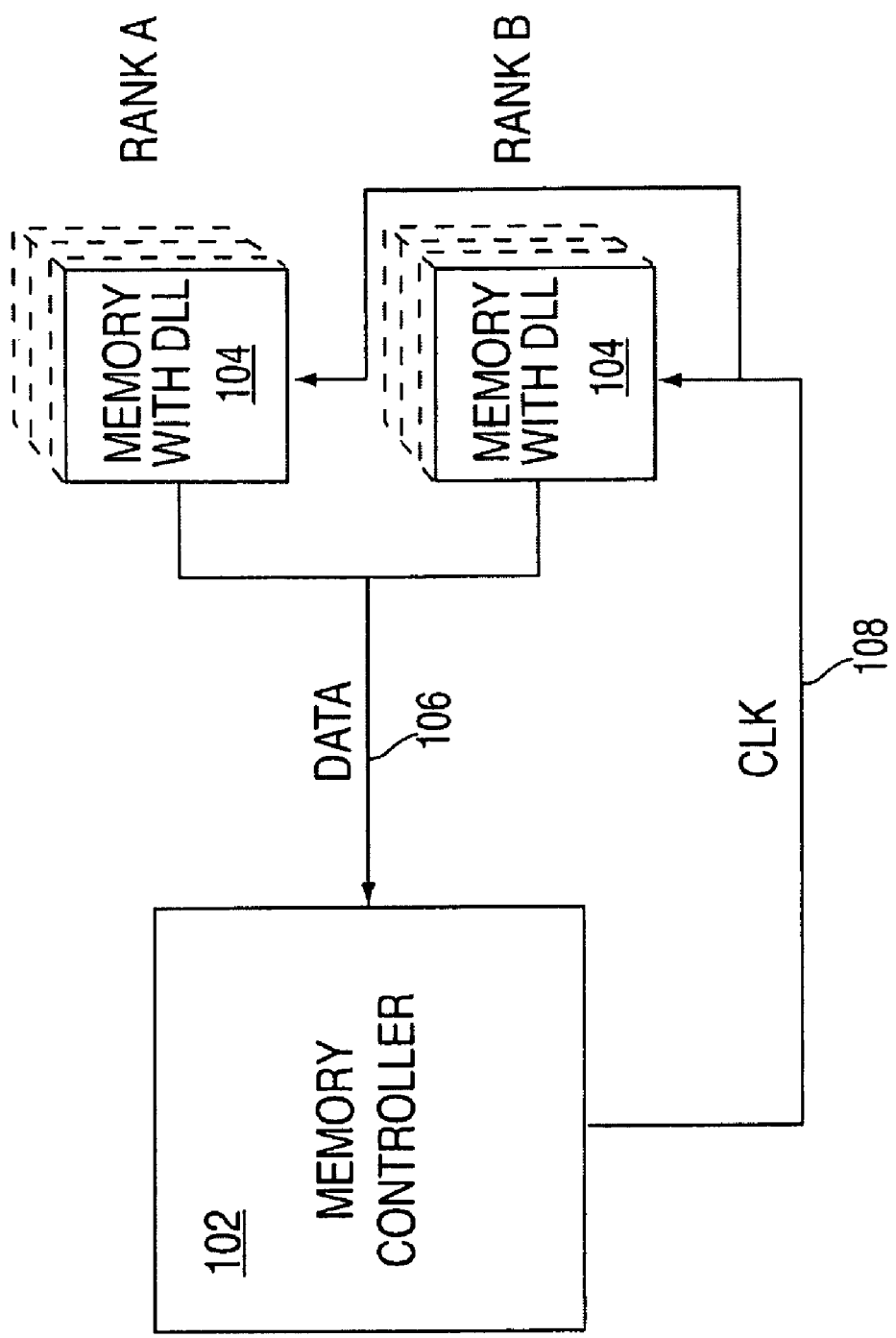
FIG. 1 depicts a conventional memory clocking architecture that may be implemented by a memory system.

Exemplary embodiments of the present invention provide memory devices that reduce power consumption and improve performance (e.g., by improving address, command, and control bus utilization).

Exemplary embodiments include reduced power memory devices. In exemplary embodiments, the memory device power is reduced by removing all or a portion of the circuitry comprising the delay locked loop (DLL) from the memory device. The memory device retains the ability for data to be read from two or more different ranks of memory devices, back-to-back, by introducing additional dynamic random access memory (DRAM) clocks. The "core" DRAM clock is retained for use in clocking internal DRAM functions and capturing one or more of address, control, and command signals, with no DLL needed to accomplish these functions. To allow for memory device operation without a DLL, exemplary embodiments include new clocks for one or more of read and write data transfer, with a data clock provided to each rank of memory in conjunction with a variable delay line (VDL) for each data clock in the memory controller or other data receiving device to allow the memory controller (or other data receiving device) to control the time at which data is transferred from each rank of memory device(s) to the receiving device. Thus, data can be read from two or more ranks of memory devices back-to-back and/or read from a single rank of memory devices with the data transfer timings controlled by the receiving device. In this exemplary embodiment, the DLL is removed from each memory device (resulting is a power savings) and data clocking circuitry (e.g., the DLL functionality) is moved into the memory controller and/or data receiving device, where it can be implemented in a different manner and shared across many memory devices (rather than including a DLL in each memory device). By removing the DLL circuitry from each memory device, significant power savings can be obtained given the large number of memory devices connecting to a data receiving device (e.g. a memory controller, a memory data buffer, a memory data register, etc).

Other exemplary embodiments reduce power consumption in a memory device by removing the traditional DLL function in the memory device, and replacing it, in each memory device, with a vernier or passively controlled delay line. The memory controller and/or data receiving device adjusts the vernier or passively controlled delay line within the memory device(s) on a periodic basis to permit data transfers to be completed back-to-back between different ranks of memory device(s) by controlling the time at which each of the memory devices transfer data. In an exemplary embodiment, the data from the faster memory devices being read from a rank are delayed to align closely with the slower memory devices in the rank, with the slowest memory devices having a smaller (if any) data delay in relation to the faster devices. Because the average delay time of the passively controlled delay line is shorter than that of a conventional delay line, there are a smaller number of delay elements in this invention. In other words, in a memory device including a conventional (DLL) delay line, even the slowest memory device's data delay is greater than zero while the delay becomes zero in this invention. In alternate exemplary embodiments the data delay to each memory device in a rank is separately controlled by one or more verniers or passively controlled delay lines within the memory device to cause the data to be returned to the receiving device (e.g. a memory controller) at a time selected by the receiving device to maximize the ability of the receiving device to accurately capture the data being read. By removing the phase locking circuitry controlling the data transfer time (e.g. data delay) from the memory devices and including such circuitry in the (fewer) data receiving devices, the exemplary memory devices, as well as the systems using such devices, consume less power than if a DLL is included in each of the memory devices. This reduction of power is accomplished while retaining the same data transfer rate and back-to-back read data transfer capability between different ranks of memory as memory devices that include a DLL.

Other exemplary embodiments reduce the amount of "dead time" where the data strobe signal(s) (which are used by the receiving device to capture the data being received) begin to switch but data cannot be transferred to a recipient until the data strobe signal(s) achieve a stable switching condition. As data transfer speeds increase, the unusable dead time (referred to herein as the "preamble" time) increases due to the reduction in the data valid time (e.g. data valid "window"). Increased data transfer speeds result in the need for increased data strobe accuracy and/or stability to ensure data is captured with a high degree of accuracy and consistency. The increased data strobe preamble time reduces the amount of time available for data transfers, thereby increasing the amount of "dead time" on the data bus and reducing the benefit of the higher data transfer speed. Exemplary embodiments utilize the dead time on the data bus, while the data strobe is stabilizing, to transfer data at a slow rate (e.g. a rate that permits data to be captured without the need of a data strobe or with the use of the strobe during a period in which the strobe has a reduced timing accuracy). The information is transferred, during the previously "dead time", at slower rates—while still ensuring that the information is accurately captured by the receiving device. This can result in one or more of: a savings of pin-count on the memory device (one or more unique pin(s) would not be needed for the signal(s) being sent during the previously dead time); an increase in data transfer reliability with the previously dead time permitting error detection information to be transferred in addition to the data; an increase in memory functionality (e.g., by using the previously dead time to enable the inclusion of data masking and/or data inversion information); and a reduction in the number of data transfers completed during the time at which the data strobe is in a stable state by making use of the previously dead time to transfer a portion of the total number of data transfers.

Further exemplary embodiments include a memory device with reduced command decode/command transfer bandwidth utilization as well as a power reduction. A dynamic memory device in a conventional "power-down" state must be periodically awakened (requiring a command to do so), refreshed (requiring another command), and then put back into the original power down state (requiring yet another command). In the example cited, it would be possible to execute the three commands using no command bandwidth simply by switching the clock enable (CKE) signal in a predefined (e.g., a serial) sequence. The CKE control signal (or other such control signal) is separate from the normal command decodes and is used primarily for changing power states. Exemplary embodiments implement new decodes that are completed using a pre-defined serial sequence of CKE levels, while maintaining the existing (e.g. backward-compatible) CKE operation with no changes. In exemplary embodiments, this is implemented as an optional feature in memory devices, with exemplary memory devices offering lower power consumption and more command bandwidth availability to systems using the exemplary memory devices. Exemplary memory device(s) are not required to be awakened to be able to perform a refresh command, which results in less state transitions of the device and refresh commands do not need to be passed to the memory device(s) such that other commands can utilize the command bandwidth. Exemplary embodiments implement the concept of embedding a serial operation on a pin that is conventionally specified for operation wherein a signal level is established and maintained for several clock cycles prior to being switched to another level, with the exemplary serial operation thereby reducing the required command bandwidth for changing states within the memory device(s) and reducing the system power consumption while retaining the original control mode(s) and operability; thus, the pin now has two operational modes.

Still further exemplary embodiments are directed to a memory array addressing and sense decoder structure within a memory device that enables a smaller page size to be accessed without a significant increase in a die size/cost. The smaller page size results in a reduction of memory activation power and may permit higher system performance with the availability of more memory pages.

A major component of current main memory device power is the power required for the DLL (delay locked loop). A relatively large amount of power usage may be saved in a memory system by removing the DLL from a memory device because each individual memory device (e.g., a synchronous DRAM) in the system includes a DLL that consumes power. However, eliminating the DLL in a contemporary memory device will result in the addition of a timing bubble (penalty) between data transfers caused by memory access delay variation among DRAM devices—especially when two or more ranks of memory are interleaved on a shared bus and read data transfers occur from one rank of memory devices followed by read data transfers from another rank of memory devices.

FIG. 1 depicts a conventional memory clocking architecture that may be implemented by a memory system. The architecture includes a memory controller 102 sending a clock 108 to each of the memory devices 104 in the memory system. Two ranks of memory devices are depicted in FIG. 1 with each rank including one or more memory devices 104 (a typical rank includes eight to eighteen or more memory devices 104). During a memory read operation, each memory device 104 in a selected rank (e.g. rank A or rank B) transmits data via a data bus 106 to the memory controller 102. The memory devices 104 in FIG. 1 each include a DLL.

Figure 2:
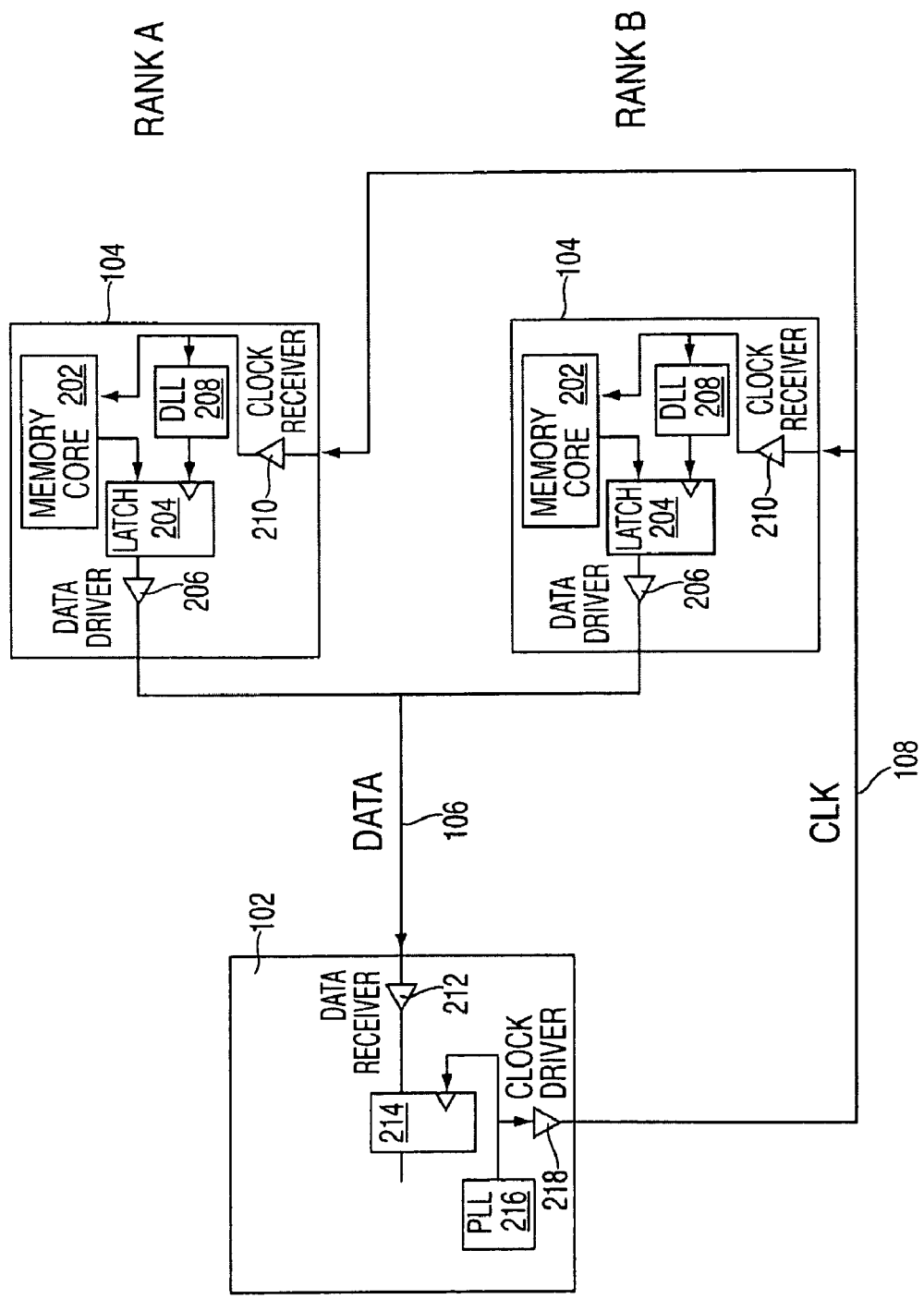
FIG. 2 depicts a more detailed view of the memory system of FIG. 1.

FIG. 2 depicts a more detailed view of the memory system of FIG. 1. The memory controller 102 includes a data receiver 212 for receiving "read" data on the data bus 106 as well as a clock driver 218 for driving the clock 108. In addition, the memory controller includes a phase lock loop (PLL) 216 and a latch 214 for latching the data read from the memory. Each memory device 104 depicted in FIG. 2 includes a memory core 202 where the data is stored, a data driver 206 for driving data on the data bus 106, a latch 204 for latching the data read from the memory core 202, a DLL 208, and a clock receiver 210. The memory devices 104 depicted in FIG. 2 are conventional synchronous double data rate (DDR) memory devices where the clock 108 is sourced from the memory controller 102 and is fed into the memory core 202 to control a data access operation. The clock 108 is also fed into the DLL 208, with the DLL initialized to cause data to be driven from the memory device 104 at a time relative to clock 108 and to compensate for such elements as propagation delays (caused for example, by delays of a clock receiver, clock distribution tree, latch and/or data output driver) so that the output data edge is aligned with the clock edge.

Figure 3:
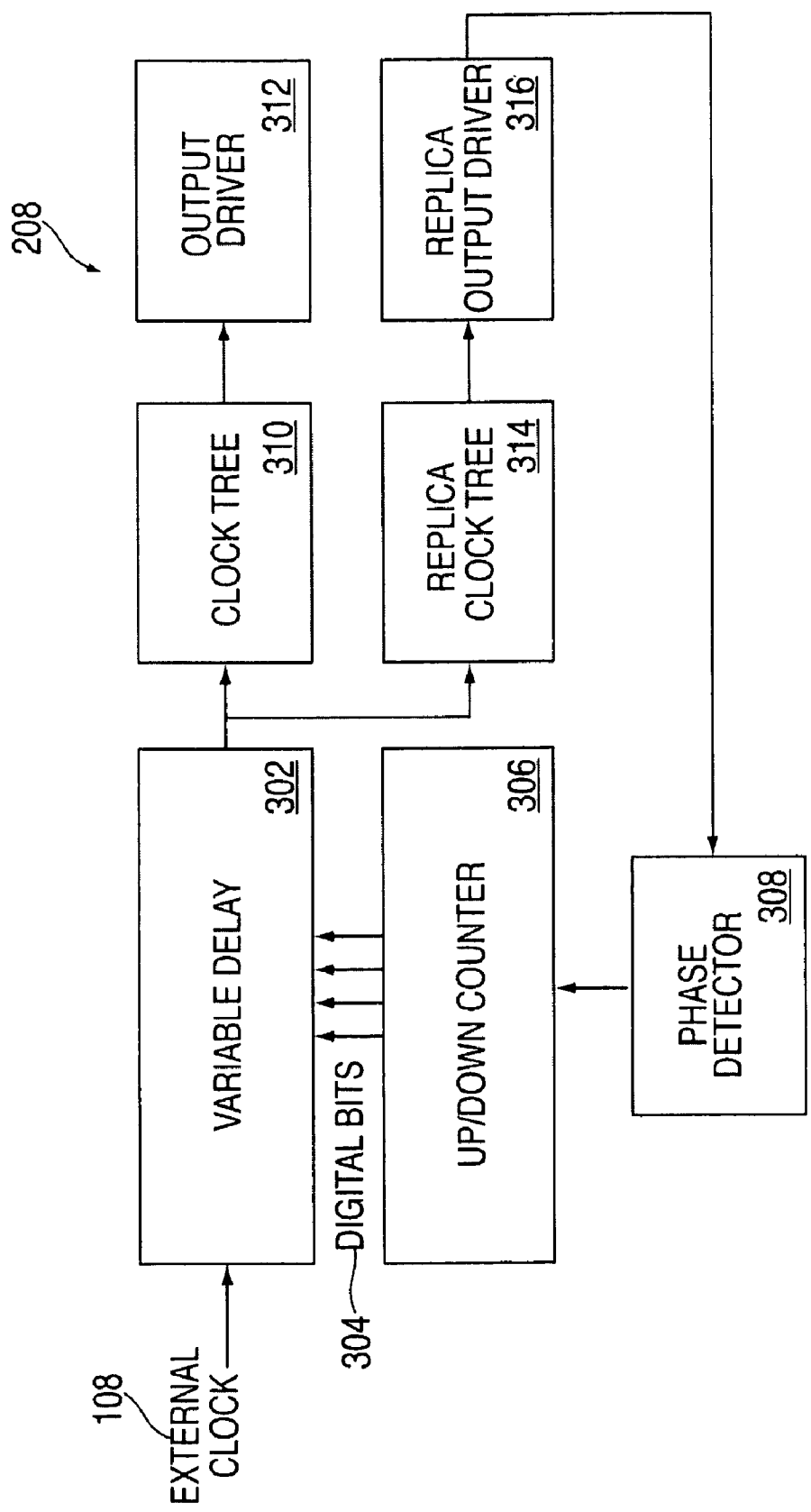
FIG. 3 depicts delay locked loop (DLL) that may be utilized by the memory system of FIG. 1.

FIG. 3 depicts a more detailed view of the DLL 208 depicted in FIG. 2. The DLL 208 includes a variable delay block 302 that receives the external clock 108 and adjusts the clock based on digital bits 304 received from an up/down counter 306. The clock output by the variable delay block 302 is sent through a clock tree 310 and then to an output driver 312 for output to the latch 204. The clock output by the variable delay block 302 is also sent through a replica clock tree 314 and a replica output driver 316. Output from the replica output driver 316 is sent to a phase detector 308 to be used as input to the up/down counter 306, which then forwards the required digital bits to establish the current delay in variable delay 302 based on drift detected by phase detector 308. As is known in the art, drift may be due to a variety of factors such as, but not limited to temperature and voltage variations. The internal monitoring and control loop in the DLL 208 (e.g. the replica clock tree 314, the replica output driver 316, the phase detector 308 and the up/down counter 306) runs at the speed of the clock and consumes an appreciable amount of power (especially when the memory device is in an otherwise "idle" state).

Figure 4:
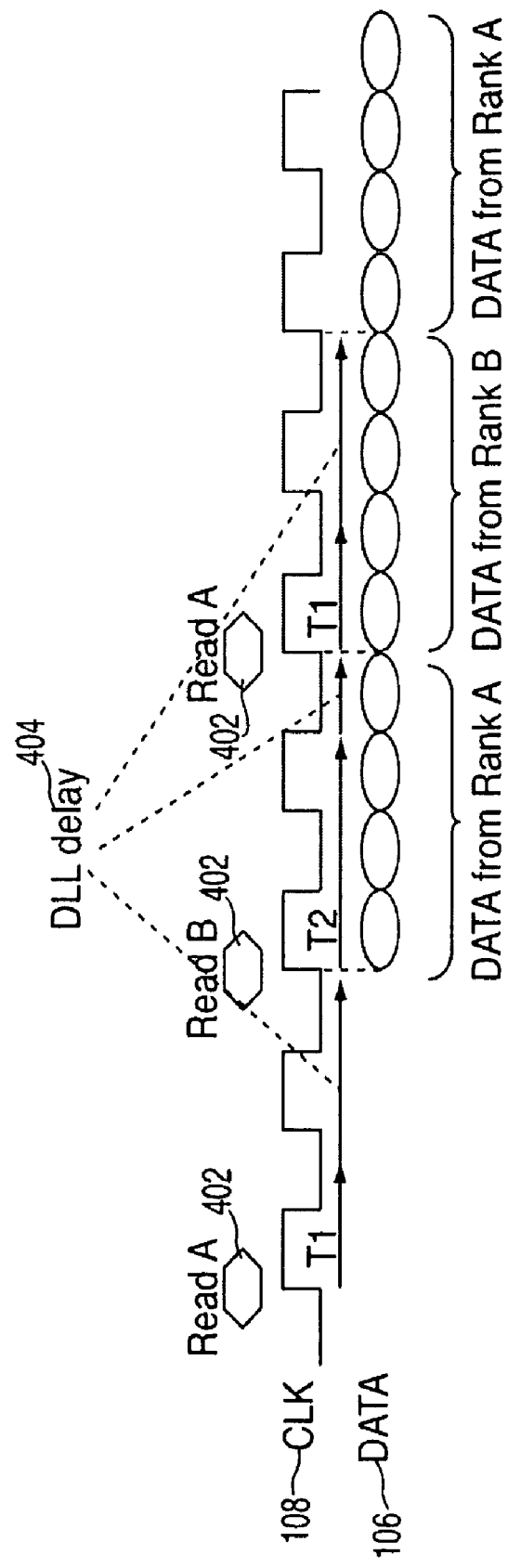
FIG. 4 depicts a timing diagram of read data burst transfer operations from two ranks of memory devices having DLLs.

FIG. 4 depicts a timing diagram describing read data burst transfer operations from two ranks of memory devices having a DLL. FIG. 4 shows three read commands 402, the clock 108 and contents of the data bus 106. The first read command 402 ("Read A") is directed to a memory device in memory rank A and is captured on the rising edge of the clock 402. Two cycles later, a transmission of a burst of four data bits from the memory device in rank A is started on the data bus 106. The data burst is delayed from the read command based on the performance characteristics of the memory device(s) 104 in rank A as calculated and adjusted relative to clock 108 by a DLL 208 on the memory device being read. The portion of the read data delay controlled by the DLL is shown in FIG. 4 as a DLL delay 404. The next read command 402 ("Read B") depicted in FIG. 4 is directed to a memory device 104 in memory rank B and is also captured on a rising edge of the clock 108. Again, data returned on the data bus 106 includes a time delay controlled by a DLL 208 on the memory device being read. As depicted in FIG. 4, the DLL delay 404 controlling the time at which data is output by rank A memory devices 104 may be different than the DLL delay 404 controlling the time at which data is output by rank B memory devices 104 such that back-to-back data transfers from two ranks of memory can occur with no or minimal overlapping of data from the two ranks being read.

Figure 5:
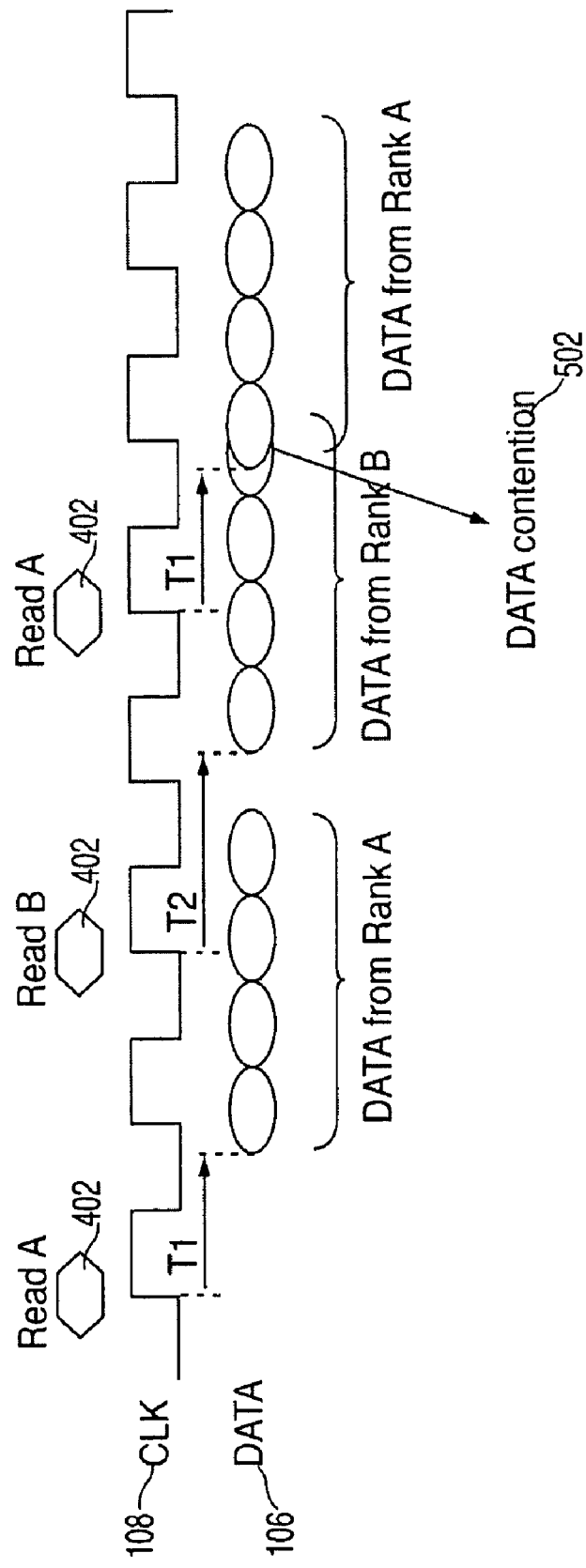
FIG. 5 depicts a timing diagram of read data burst transfer operations from two ranks of memory devices that do not have DLLs.

FIG. 5 depicts a timing diagram that shows the data contention 502 that can occur when data is read (e.g. from two different memory ranks) when a DLL is not utilized on the memory device(s) in the two or more memory ranks to maintain a time synchronization relative to clock and compensate for such elements as clock insertion delay, temperature, voltage variation and/or drift that occur in the memory devices. As is known in the art, data contention 502 should be avoided as data may not be accurately captured by the receiving device due to the data contention and/or memory device damage may occur.

Figure 6:
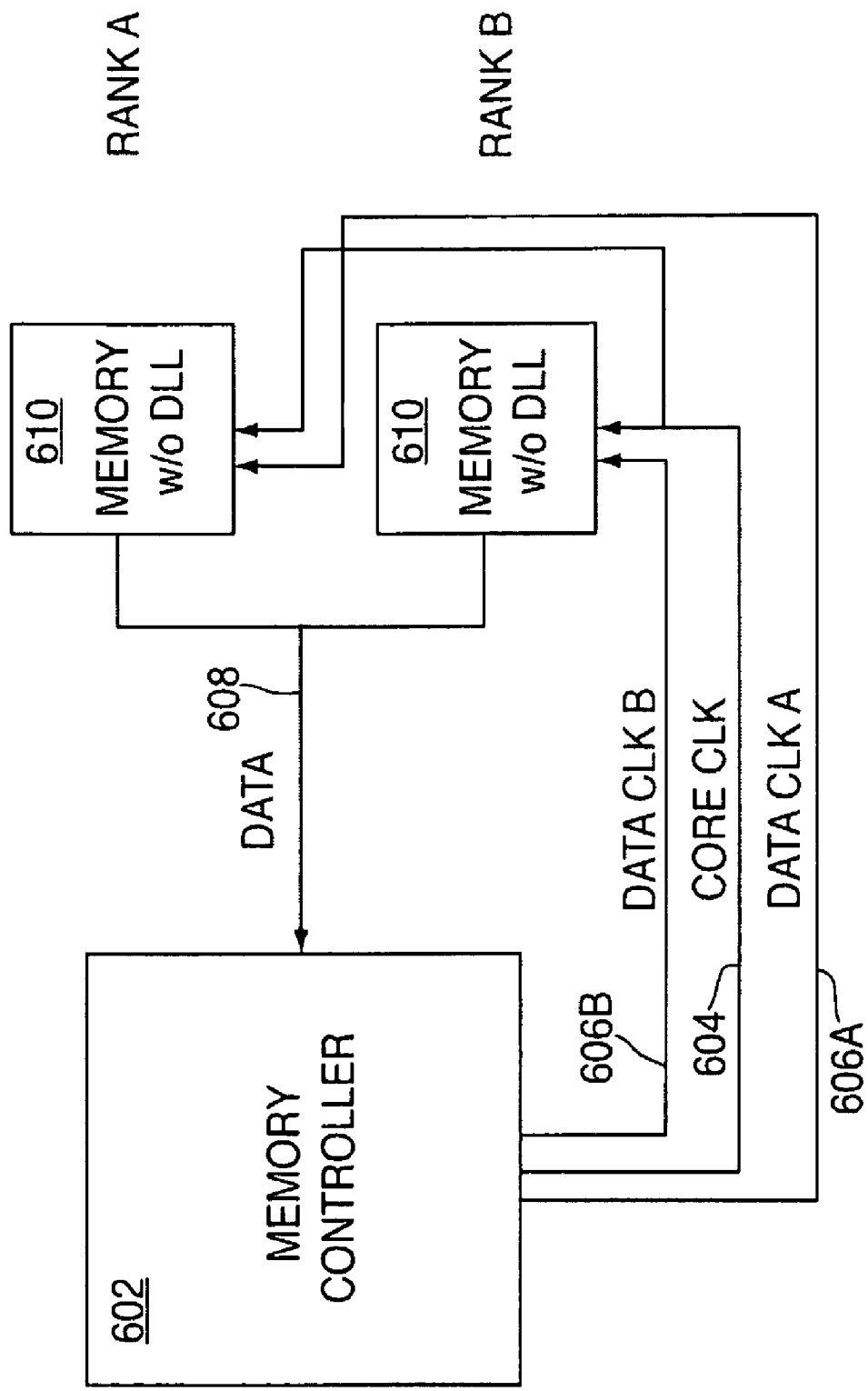
FIG. 6 depicts a memory system that may be implemented by an exemplary embodiment of the present invention.

FIG. 6 depicts a memory system that may be implemented by an exemplary embodiment of the present invention. The memory devices 610 in the memory system depicted in FIG. 6 do not include DLLs. The memory system includes a memory controller 602 that generates a core clock 604 for distribution to all of the memory devices 610 in rank A and rank B to maintain memory core operations and capture information sent to the memory devices 610 such as one or more of command, control, and address signals. In addition, the memory controller 602 generates a separate data clock 606 (in this example, data CLK A 606A and data CLK B 606B) for each rank of memory devices. The memory controller 602 includes DLL, PLL or other such clocking circuitry to monitor drift (e.g. variations in the time in which data is received from memory rank A and memory rank B on data bus 608) and to adjust the timing of the data clocks 606 to each memory device rank such that data can be accurately captured by the memory controller and data contention does not occur on data bus 608. As depicted in FIG. 6, a data bus 608 sends data to the memory controller 602.

Figure 7:
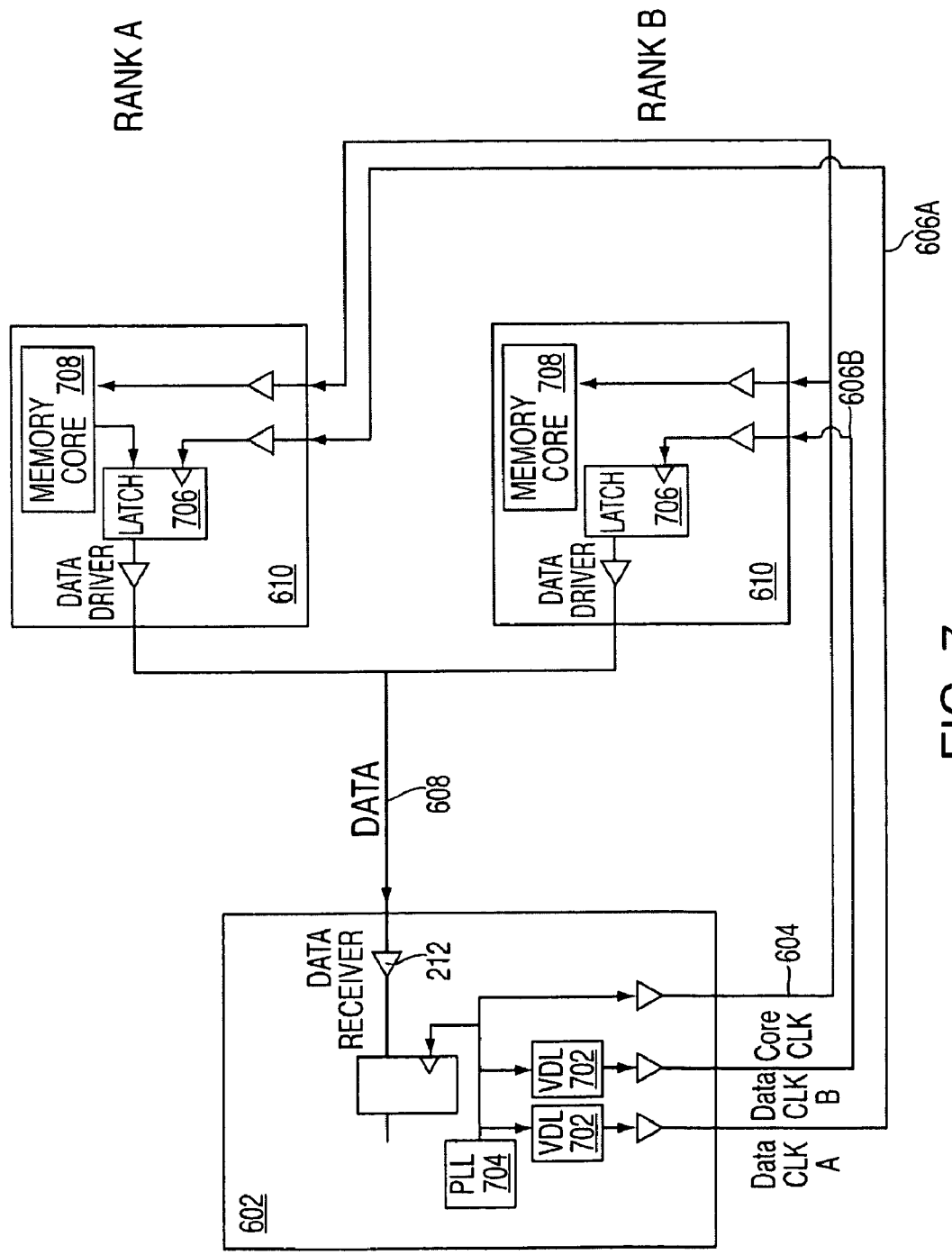
FIG. 7 depicts a more detailed view of the exemplary memory system depicted in FIG. 6.

FIG. 7 depicts a more detailed view of the exemplary memory system depicted in FIG. 6. The memory devices 610 depicted in FIG. 7 each receive two different clocks: the core clock 604 and a data clock 606 (e.g., data CLK A 606A or data CLK B 606B). The core clock 604 is fed to the memory core 708 and the data clock 606 is fed to a latch 706 and used for controlling the time at which read data is transferred. Write data capturing may use either the core clock 604 or the data clock 606. The exemplary memory controller 602 includes a phase lock loop (PLL) 704 and variable delay lines (VDLs) 702 for setting the time relationship between the data clocks 606 and core clock 604. The VDLs 702 are programmed by the memory controller 602 to cause the data to be returned from each rank of memory devices at a specific time relative to core clock 604. In an exemplary embodiment, the memory controller 602, at initialization, adjusts the amount of the delay of each VDL 702 so that the output from each rank is synchronized to the core clock 604 with a delay value relative to core clock 604 that will enable the memory controller to accurately capture read data from each rank of memory devices and minimize or prevent data contention between data read from each rank. This allows the DLL to be removed from the memory devices 610 and the functionality to be moved to the memory controller 602. In the exemplary embodiment, a power savings results from having the data clock phase lock circuitry (e.g. as provided by PLL 704) and VDL 702 being shared by several memory devices 610 within the same rank.

Figure 8:
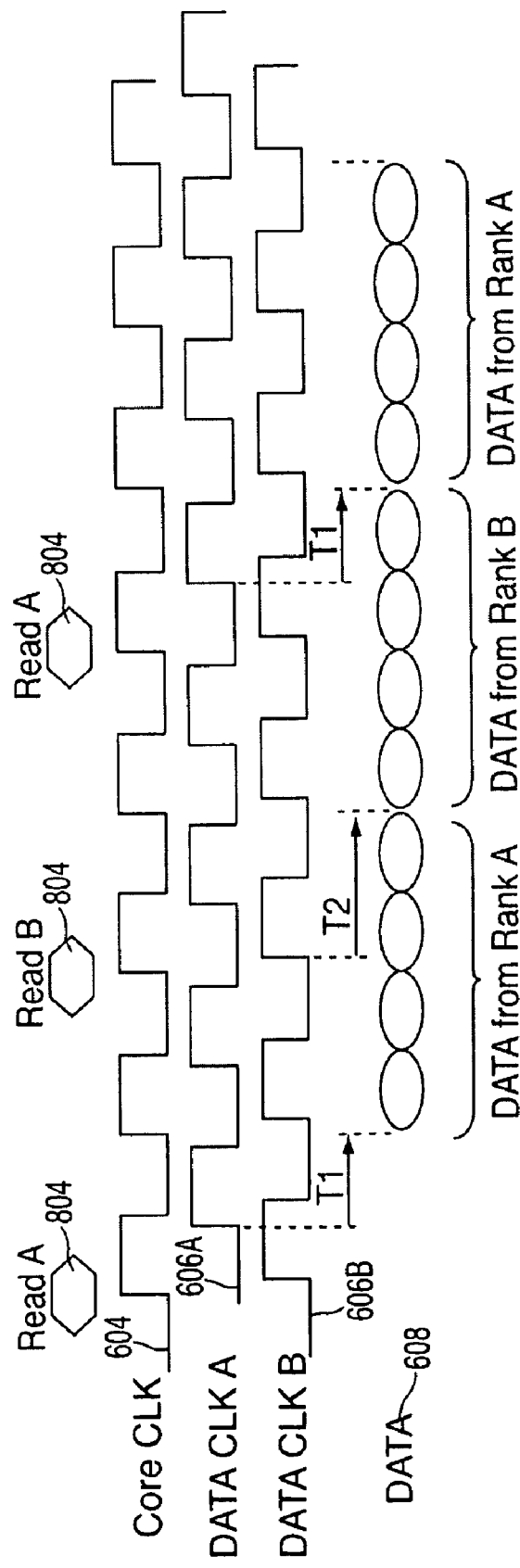
FIG. 8 depicts a timing diagram for the exemplary memory system depicted in FIG. 6.

FIG. 8 depicts a timing diagram for the exemplary embodiment depicted in FIG. 7. It illustrates that by adjusting the timing of the data clocks 606, the final output on the data bus 608 is synchronized to the core clock 604. FIG. 8 shows three read commands 804 sent to memory devices 610 in two different memory ranks (e.g. rank A and rank B), the core clock 604, data clock A 606A, data clock B 606B, and the contents of the data bus 608. The first read command 804 ("Read A") is directed to data on a memory device 610 in memory rank A and is captured on the rising edge of the core clock 604. A transmission of a burst of four data bits from rank A is started on the data bus 608 at a time determined by data clock A 606A. The time relationship of data clock A 606A to core clock 604 is calculated and adjusted by the memory controller 602. The next read command 804 depicted in FIG. 8 ("Read B") is directed to data on a memory device 610 in memory rank B and is also captured on the rising edge of the core clock 604. A transmission of a burst of four data bits from rank B is started on the data bus 608 at a time determined by data clock B 606B. The time relationship of data clock B 606B to core clock 604 is determined by the memory controller 602. As depicted in FIG. 8, different ranks may drive data at different times than other ranks relative to data clocks 606 (as shown by times "T1" and "T2" for data read from rank A and data read from rank B respectively), based on one or more factors such as memory device access time variations, data clock net length variations (e.g. to different ranks of memory devices), data net length variations, temperature variations between memory devices, etc. In the embodiment depicted in FIG. 8, the core clock 604 runs at the same frequency as the data clocks 606. In other embodiments, they operate at different speeds.

Figure 9:
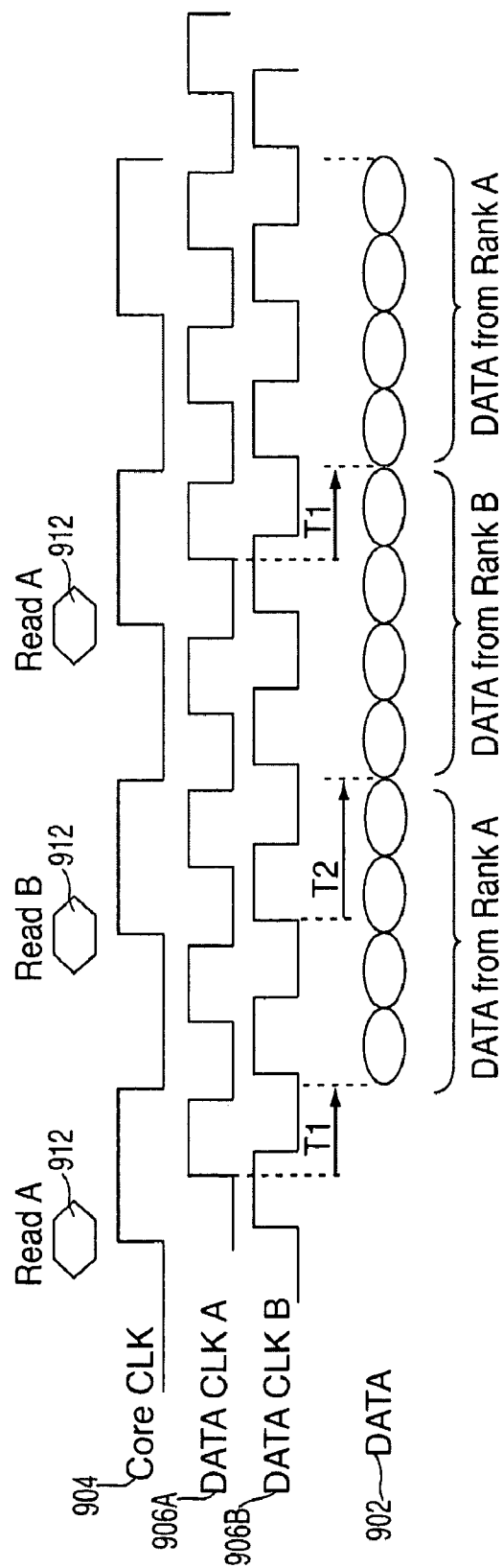
FIG. 9 depicts an exemplary embodiment where a core clock and a data clock have different frequencies.

FIG. 9 depicts an exemplary embodiment where a core clock and a data clock have different frequencies. Typically, a memory core operates at a slower frequency than an input/output (I/O) (e.g. data transfer) speed and operating the memory core (e.g., internal controller and logic) at the slower speed also saves power. This ability to operate the memory core and I/O at different frequencies is not available using current clocking schemes because the same clock is used for both the memory core and the I/O. Running the core clock 904 at a slower frequency also enables a slower signaling rate for command and address signals. Contemporary command and address signals do not require the same transfer rate as data because the memory core operating speed is slower than the I/O transfer speed.

FIG. 9 shows three read commands 912 from memory devices in two different memory ranks, a core clock 904, data clocks 906 (data clock A 906A and data clock B 906B), and contents of a data bus 902. The first read command 912 ("Read A") is directed to data on a memory device in memory rank A and is captured on the rising edge of the core clock 904. A transmission of a burst of four data bits from rank A is started on the data bus 902 at a time determined by data clock A 906A. The time relationship of data clock A 906A to core clock 904 is calculated and adjusted by the memory controller 602. The next read command 912 ("Read B") depicted in FIG. 9 is directed to data on a memory device in memory rank B and is also captured on the rising edge of the core clock 904. A transmission of a burst of four data bits from rank B is started on the data bus 902 at a time determined by data clock B 906B. The time relationship of data clock B 906B to core clock 904 is determined by the memory controller 602. As depicted in FIG. 9, the core clock 904 and a data clocks 906 have different frequencies.

Figure 10:
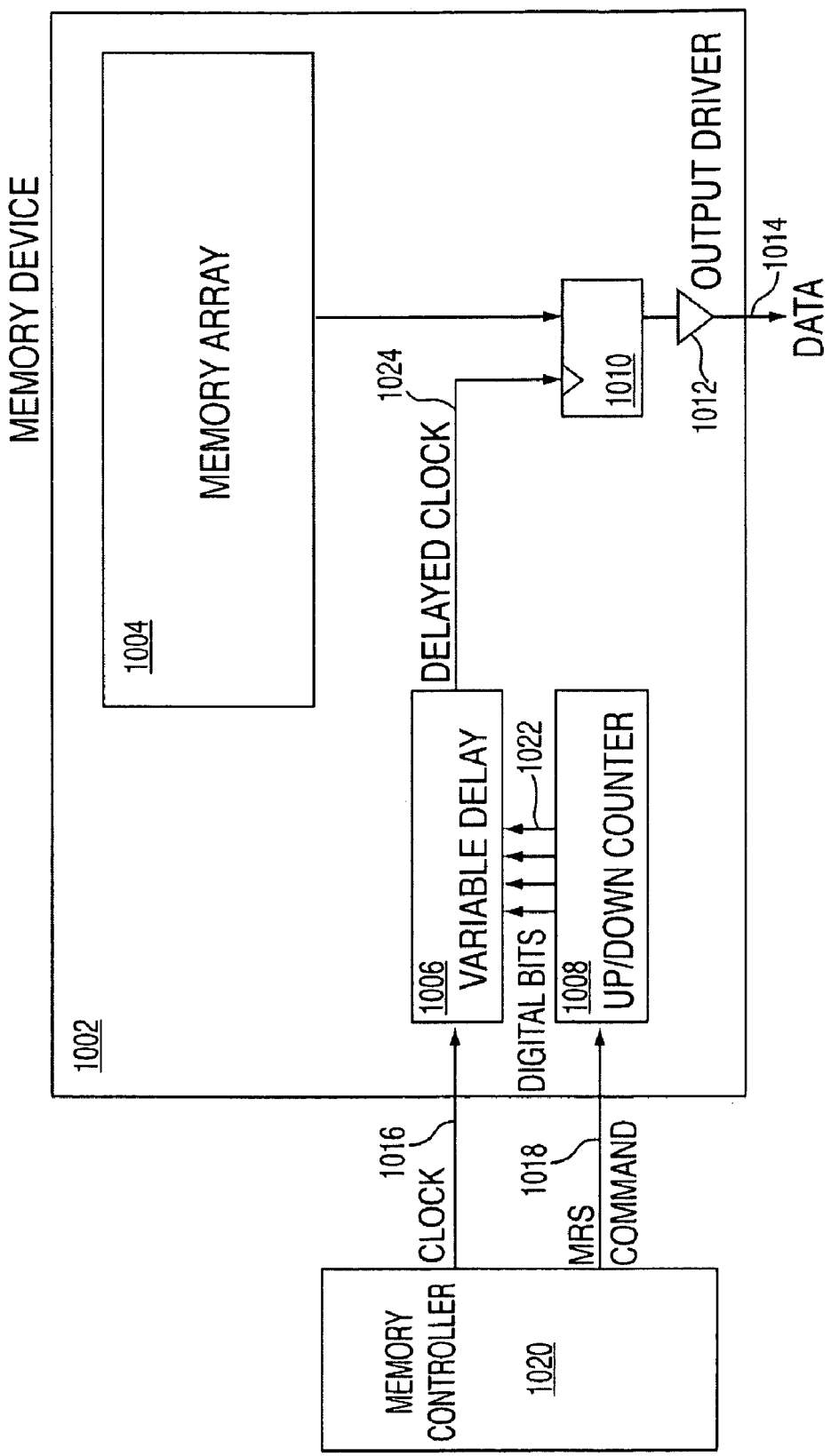
FIG. 10 depicts an exemplary embodiment where a memory device includes a passive variable delay circuit controlled by a memory controller.

FIG. 10 depicts an exemplary embodiment of the present invention where portions of the DLL functions are located in a memory device 1002 and the other portions are located in a memory controller 1020. Referring to FIG. 10, the memory device 1002 depicted in FIG. 10 includes a memory array 1004 for storing and retrieving data and a variable delay block 1006 (also referred to herein as a "passive variable delay circuit"). The variable delay block 1006 receives an external clock 1016 (e.g., from the memory controller 1020) and delays the clock 1016 based on digital bits 1022 from an up/down counter 1008, the adjusted clock is the delayed clock 1024. The up/down counter 1008 generates the digital bits 1022 in response to a command, such as a mode register set (MRS) command 1018 from the memory controller 1020.

The up/down counter 1008 is one example of a variable delay controller that may be implemented by exemplary embodiments, another example of a variable delay controller that is described below is a mode register. Other variable delay controllers may be implemented by other exemplary embodiments. As described herein, the variable delay controller periodically receives delay commands (e.g. MRS commands) from a source external to the memory device 1002 (e.g., a memory controller 1020, a memory hub, a buffer device or other such device connected to the memory device 1002, or other source not located on the memory device 1002). The variable delay controller then generates delay information bits (or "digital bits 1022" as depicted in FIG. 10) that are used by the variable delay block 1006 to generate the delayed clock 1024.

In exemplary embodiments, the variable delay block 1006 is implemented by a passive variable delay circuit where no feedback circuitry exists within the delay circuitry on the memory device 1002 to provide continuous or periodic adjustments to the delay value. As described herein, the passive variable delay circuit receives a clock 1016 from a source external to the memory device 1002 (e.g., a memory controller 1020, a memory hub or buffer device connected to the memory device 1002, or other source not located on the memory device 1002). The passive variable delay circuit also receives delay instruction bits generated by the variable delay controller. A delayed clock 1024 having a time relationship to the received clock 1016 (e.g., it has the same frequency as the received clock but may switch at a time equal to or later or earlier than the received clock) is generated based on the received clock 1016 and the delay instruction bits.

Referring to FIG. 10, the delayed clock output by the variable delay block 1006 triggers a latch 1010 for clocking and transmitting data from the memory array 1004 onto the data bus 1014 via the output driver 1012. In the exemplary embodiment depicted in FIG. 10, the locking circuitry is located in the memory controller 1020 (i.e., external to the memory device 1002) and the memory controller 1020 is monitoring the data bus 1014 and sending MRS commands (or other delay control commands) 1018 to the memory device 1002 to adjust the read data delay. In this embodiment, the memory controller 1020 controls when data is driven on the data bus 1014, resulting in reduced power usage by the memory device 1002. Although not shown, strobe 1808 (e.g. DQS) may be driven by the memory device(s) 1002, during read operations, in the same manner (e.g. using a delayed clock similarly derived on the memory device from clock 1016).

Figure 11:
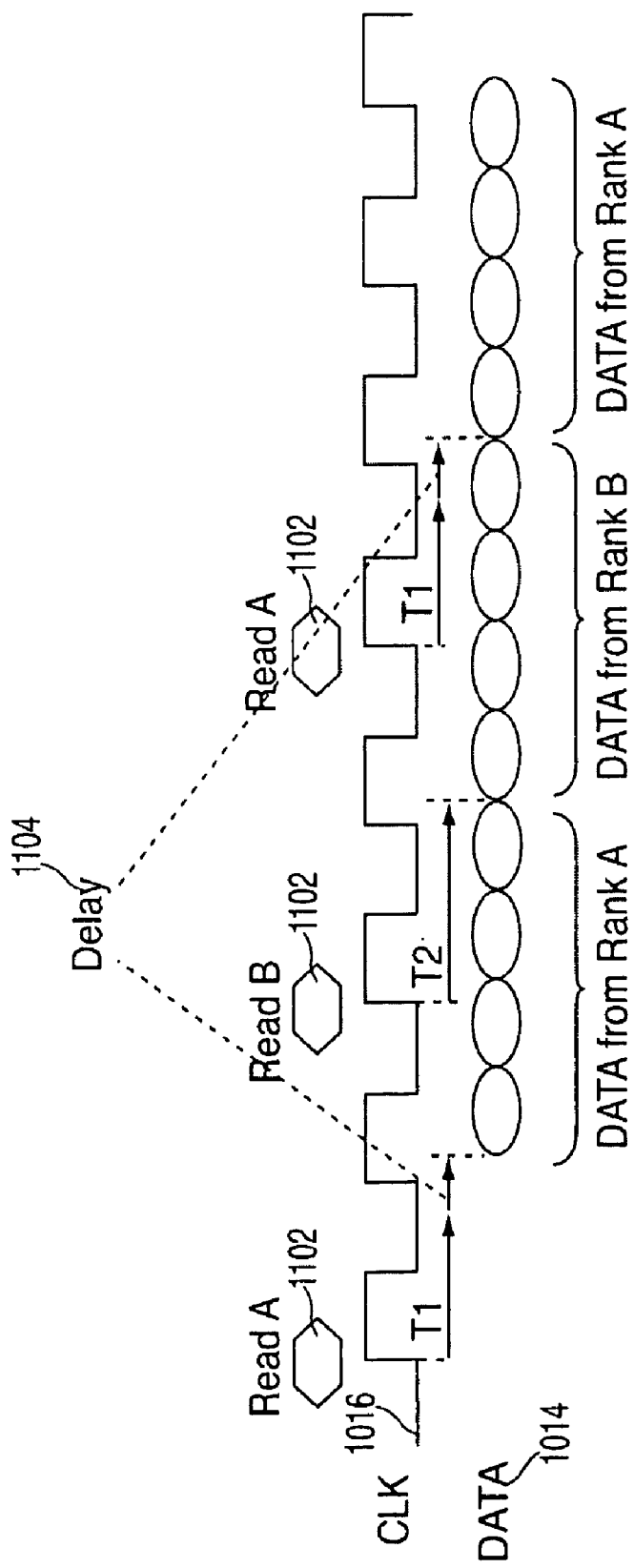
FIG. 11 depicts a timing diagram for the exemplary embodiment depicted in FIG. 10.

FIG. 11 depicts a timing diagram for the exemplary embodiment depicted in FIG. 10 where two memory devices 1002 in different ranks drive data onto data bus 1014. FIG. 11 shows three read commands 1102, the clock 1016 and contents of the data bus 1014. The first read command 1102 ("Read A") is directed to data on a memory device 1002 in memory rank A and is captured by the memory device 1002 on the rising edge of the clock 1016. Two cycles later, a transmission of a burst of four data bits from the memory device 1002 in rank A is started on the data bus 1014. The data burst is delayed relative to clock 1016 based on such elements as the performance characteristics of the memory devices 1002 in rank A as calculated by the memory controller 1020, communicated to the memory device 1002 via a MRS command 1018, and implemented by the variable delay block 1006 in the memory device 1002 being read. This delay is shown in FIG. 11 as delay 1104. The next read command 1102 ("Read B") depicted in FIG. 11 is directed to data on a memory device 1002 in memory rank B and is also captured on the rising edge of the clock 1016. Again, data returned on the data bus 1014 is delayed by an amount of time determined by the memory controller 1020, communicated to the memory device 1002 via a MRS command 1018, and implemented by the variable delay block 1006 in the memory device 1002 being read. As depicted in FIG. 11, there is no delay 1104 for rank B memory devices 1002 and there is a delay 1104 for rank A memory devices 1002. In other embodiments, the rank A and Rank B memory devices 1002 may both have delays 1104 of equal or different time durations (e.g. "lengths").

Figure 12:
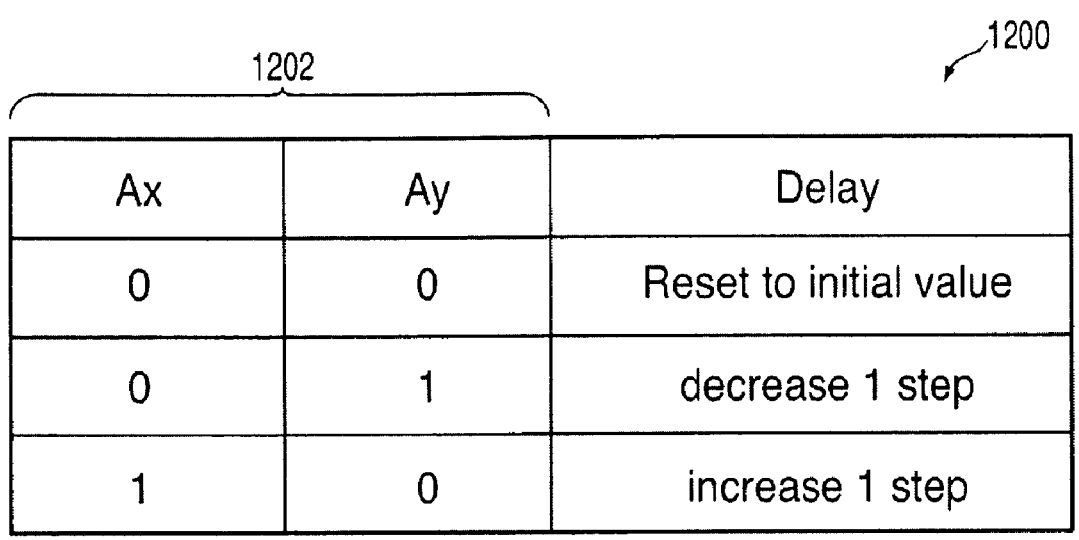
FIG. 12 depicts a command decode table having decodes for a mode register set (MRS) command that may be implemented by an exemplary embodiment.

FIG. 12 depicts a command decode table 1200 having decodes for an MRS command 1018 that may be implemented by an exemplary embodiment of the present invention. In the embodiment depicted in FIG. 12, the MRS command 1018 includes two bits: "Ax" and "Ay", referred to herein as MRS command bits 1202. When the value of the MRS command bits 1202 is "00" the up/down counter 1008 is instructed to reset the variable delay 1006 to an initial value. When the value of the MRS command bits 1202 is "01", the up/down counter 1008 is instructed to decrease the delay by one step (e.g., five picoseconds, ten picoseconds, etc.). When the value of the MRS command bits 1202 is "10", up/down counter 1008 is instructed to increase the delay by one step. As shown in the exemplary embodiment depicted in FIG. 10, the up/down counter 1008 generates digital bits 1022 which are input to the variable delay block 1006 and utilized to adjust the external clock 1016 received by the memory device 1002. The number of MRS command bits 1202 and/or the decodes associated with them may be different in other embodiments of the present invention.

Figure 13:
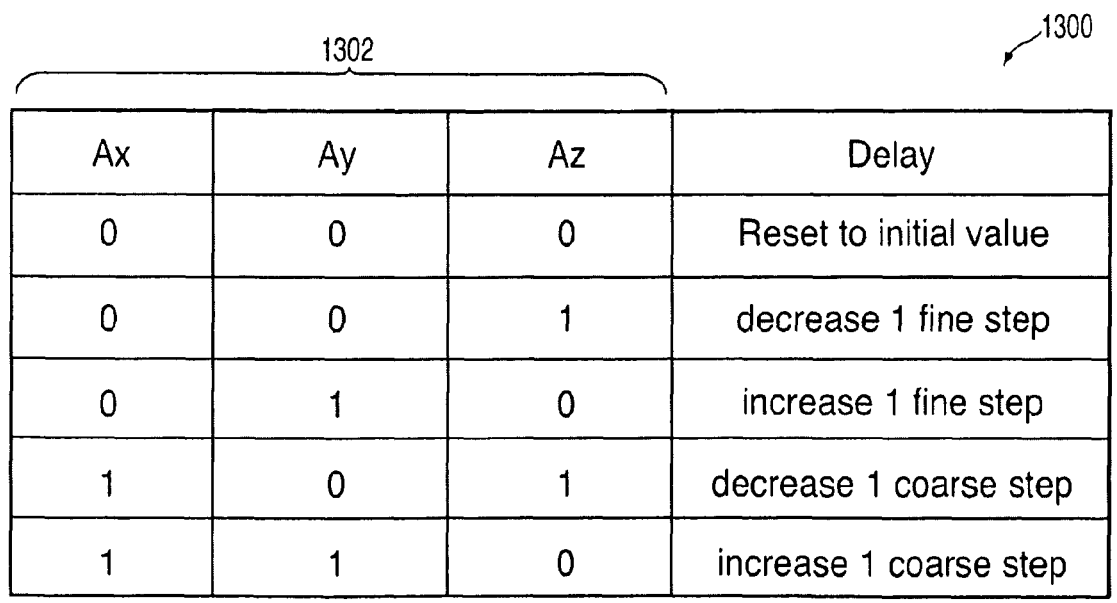
FIG. 13 depicts a command decode table for an MRS command that may be implemented by an exemplary embodiment.

FIG. 13 depicts a command decode table 1300 having decodes for an MRS command 1018 that may be implemented by an alternate exemplary embodiment of the present invention. In the embodiment depicted in FIG. 13, the MRS command 1018 is made up of three bits: "Ax", "Ay" and "Az", referred to herein as MRS command bits 1302. Because three bits are utilized, instructions with more detail may be communicated to the up/down counter 1008. For example, and as depicted in FIG. 13, when the MRS command bits 1302 are "001" the up/down counter 1008 is instructed to decrease the delay by one fine step (e.g., five picoseconds, ten picoseconds, etc.); and when the MRS command bits 1302 are "101" the up/down counter 1008 is instructed to decrease the delay by one coarse step (e.g., fifty picoseconds, one hundred picoseconds, etc.). As shown in the exemplary embodiment depicted in FIG. 10, the up/down counter 1008 generates digital bits 1022 which are input to the variable delay block 1006 and utilized to adjust the external clock 1016 received by the memory device 1002.

Figure 14:
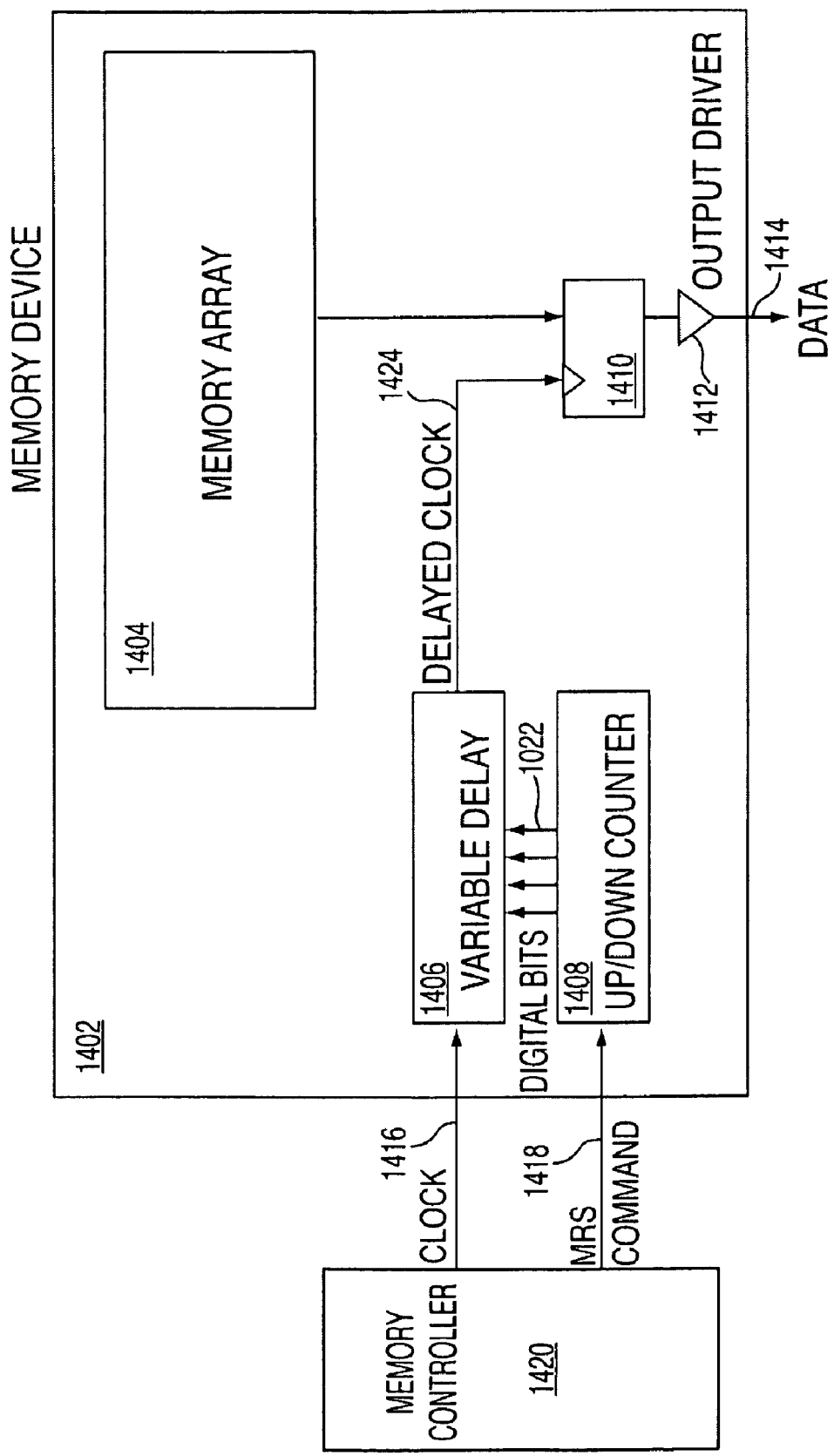
FIG. 14 depicts an exemplary embodiment where a memory device includes a passive variable delay circuit controlled by a memory controller.

FIG. 14 depicts an exemplary embodiment of the present invention, similar to the embodiment of FIG. 10, where portions of the DLL functions are located in a memory device 1402 and the other portions are located in a memory controller 1420. The memory device 1402 depicted in FIG. 14 includes a memory array 1404 and a variable delay block 1406. The variable delay block 1406 receives an external clock 1416 (e.g., from the memory controller 1420) and delays the clock 1416 based on digital bits 1422 from a mode register 1408. The adjusted clock is a delayed clock 1424. The mode register 1408 generates the digital bits 1422 in response to a command, such as a MRS command 1418 from the memory controller 1420. The clock output by the variable delay block 1406 triggers a latch 1410 for clocking and transmitting data from the memory array 1404 onto the data bus 1414 via the output driver 1412. In the exemplary embodiment depicted in FIG. 14, the locking circuitry is located in the memory controller 1420 and the memory controller 1420 is monitoring the data bus 1414 and sending MRS commands 1418 to the memory device 1402 to adjust the data delay.

Figure 15:
FIG. 15 depicts a command decode table for an MRS command that may be implemented by an exemplary embodiment.

FIG. 15 depicts a command decode table 1500 having decodes for an MRS command 1418 that may be implemented by an exemplary embodiment of the present invention. In the embodiment depicted in FIG. 15, the MRS command 1418 is made up of three bits: "Ax" 1504, "Ay" 1506 and "Az" 1508, referred to herein collectively as MRS command bits 1502. In this embodiment, the MRS command bits 1502 correspond to different multiples of a unit of time (e.g., picoseconds or other time unit). As depicted in FIG. 15, when the MRS command bits 1502 are "010", this corresponds to two units of time.

Figure 16:
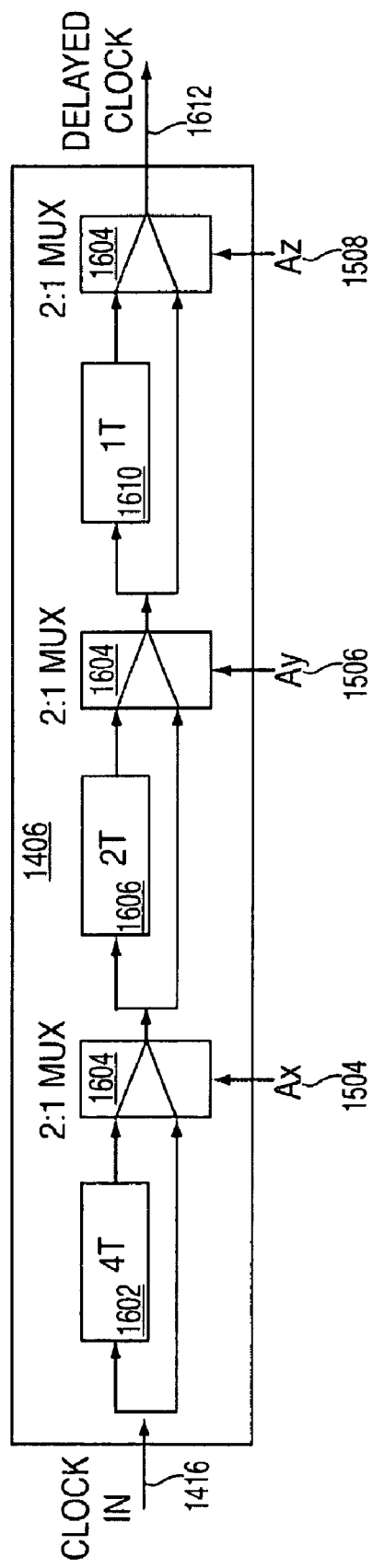
FIG. 16 depicts a variable delay that may be implemented by an exemplary embodiment.

The information in the decode table 1500 may be utilized by the variable delay block 1406 as depicted in FIG. 16. In this case, the digital bits 1422 input to the variable delay block 1406 include the three MRS command bits 1502. The clock 1416 is also input to the variable delay block 1406. As depicted in FIG. 16, the variable delay block 1406 includes three delay elements of varying lengths of time: delay element 4T 1602 having a delay of four units of time, delay element 2T 1606 having a delay of two units of time, and delay element 1T 1610 having a delay of one unit of time. The variable delay block 1406 depicted in FIG. 16 also includes three two-to-one multiplexers 1604, each receiving one of the MRS command bits 1422. Delays between zero and seven time units may be implemented by the circuitry depicted in FIG. 16. A delay of five time units is implemented when the MRS command bits 1502 are equal to "101". In this case, the clock 1416 travels through delay element 4T 1602, skips delay element 2T 1606, and travels through delay element 1T 1610, resulting in a delay of five time units. Thus, the delayed clock 1708 has a time relationship to the clock 1416 in that it is delayed by five time units (in addition to the 2:1 multiplexers 1604 and other associated circuitry not shown).

Figure 17:
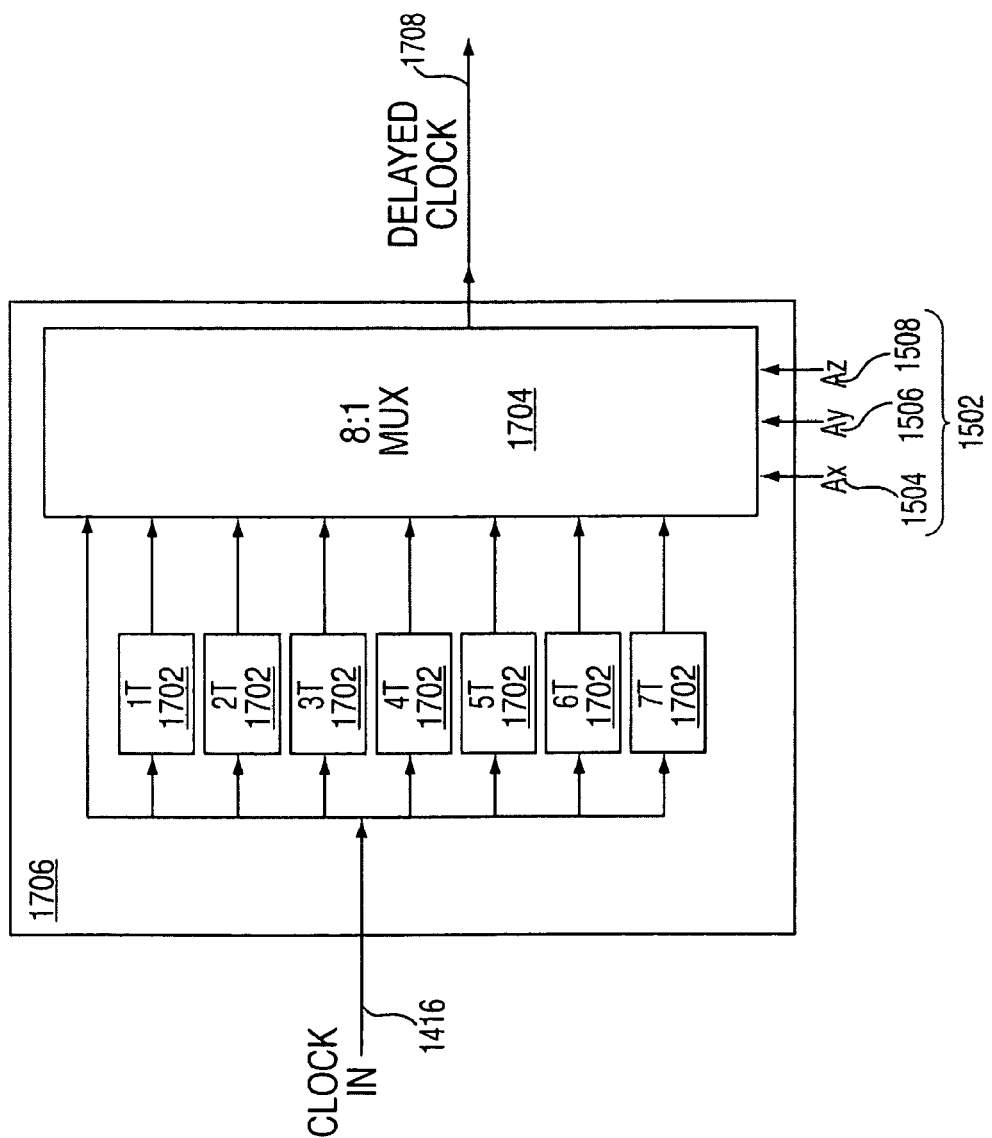
FIG. 17 depicts a variable delay that may be implemented by an exemplary embodiment.

In another exemplary embodiment, such as the one depicted in FIG. 17, the MRS commands bits 1502 are input to a multiplexer 1704 in the variable delay block 1706 for selecting which of the delay elements 1702 to apply to the clock 1416 to generate the delayed clock 1708. These are just two examples of circuitry that may be implemented, other circuitry and delay control signals may be utilized by other exemplary embodiments.

Other aspects of exemplary embodiments have to do with data writes to a memory device and minimizing the amount of time spent waiting for a data strobe to become stable before writing data.

Figure 18:
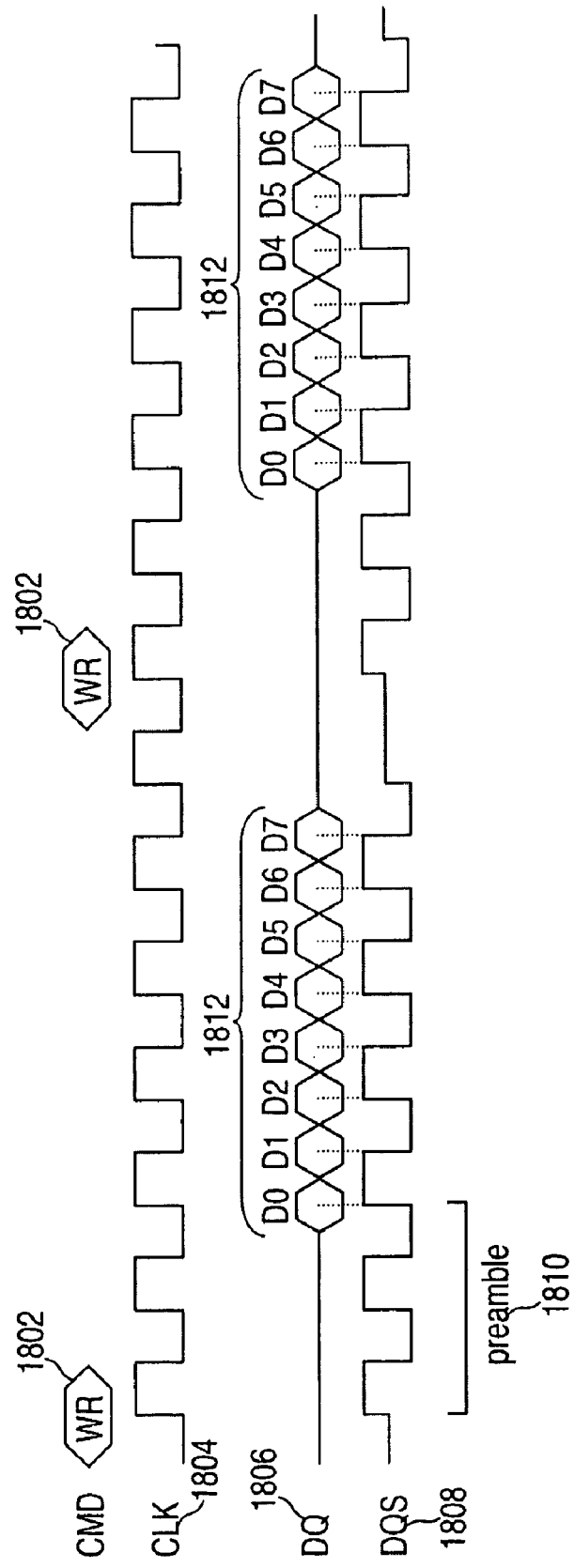
FIG. 18 depicts a prior art timing diagram for a memory write.

FIG. 18 depicts a prior art timing diagram for performing a memory write. FIG. 18 illustrates the timing of a clock 1804, data bus 1806, and a data strobe 1808 when a write command 1802 is being processed. The data strobe 1808 is used to capture data 1812 at a receiving device on the data bus 1806 in response to a write command 1802. As depicted in FIG. 18, the write data is captured in the middle of the data strobe 1808. Depending on specific memory device configurations, the data can be captured on one or both of the rising edge and the falling edge of the data strobe 1808. Typically, in order to conserve power, the data strobe 1808 is running only when data is being transferred and is driven by the same device as the data (e.g., a memory device, memory controller, memory hub, memory buffer, etc.). When data is not being transferred, the data strobe 1808 is, for example, allowed to move into an idle bus state such as a floating state where all drivers stop driving, the data strobe 1808 can be terminated such that the strobe is pulled to a known state or other methods may be utilized. When a data write command 1802 is received, the data strobe 1808 begins to switch and, after a period of time, returns to a stable switching state that can enable the capture of data 1812 on the data bus 1806 by memory device 1002— such as on a rising and/or falling strobe (DQS) 1808. It takes a certain amount of time for the data strobe 1808 to go from an idle state (e.g. a floating, terminated, etc. condition) to a stable switching state; this time is referred to as the preamble time 1810. In contemporary memory systems, the memory devices receive "write" data on the data bus 1806 once the data strobe 1808 is in a stable switching state, thereby allowing the memory devices to capture the "write" data using the rising and/or falling edges of the data strobe 1808.

Figure 19:
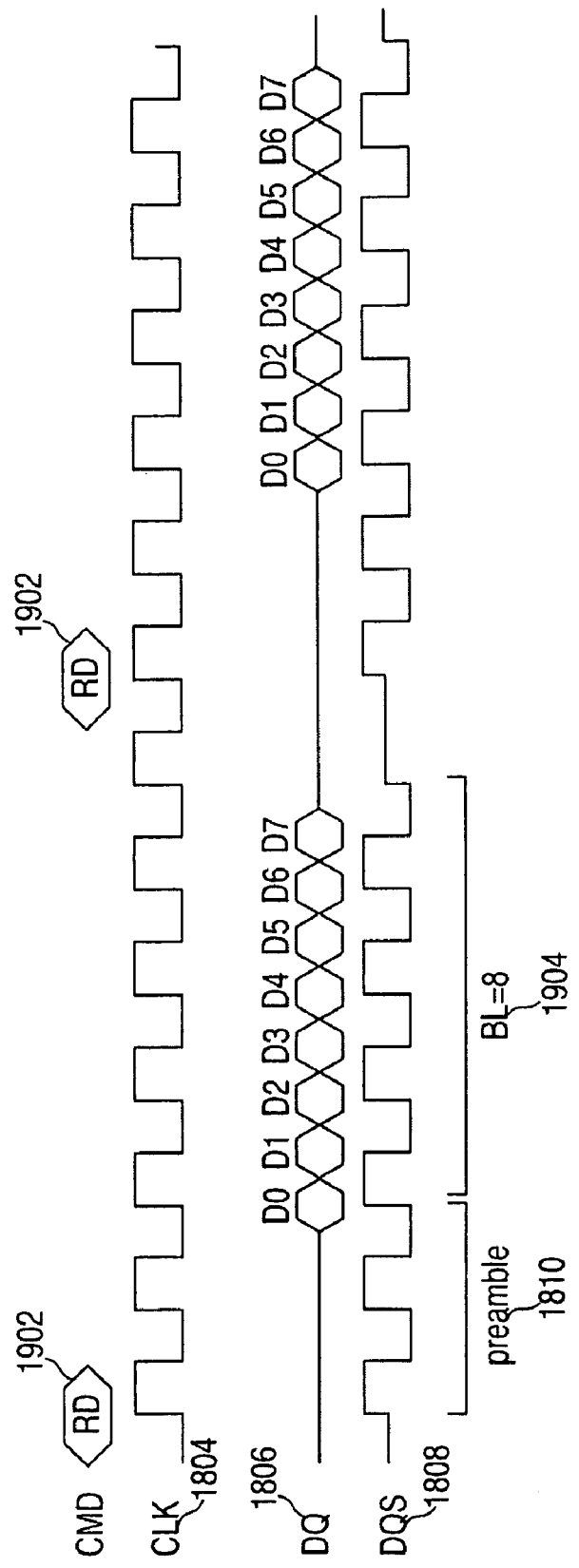
FIG. 19 depicts a prior art timing diagram for a memory read.

FIG. 19 depicts a prior art timing diagram for performing a memory read. FIG. 19 illustrates the timing of a clock 1804, data bus 1806, and a data strobe 1808 when a read command 1802 is being processed. The data strobe 1808 is used by the receiving device (e.g. the memory controller, memory buffer, member hub, etc) to capture data on the data bus 1806 in response to a read command 1902. In this example, the burst length 1904 is eight. As depicted in FIG. 19, the read data is aligned with the data strobe 1808, with the receiving device typically shifting the received strobe by 90 degrees in relation to the data to facilitate latching of the received data. As in the write operation depicted in FIG. 18, read data transfers require a stable switching data strobe 1808 to ensure that data can be accurately and reliably captured by the receiving device. A preamble time 1810 is required prior to completing read transfers to allow the data strobe 1808 to achieve a stable switching state.

Figure 20:
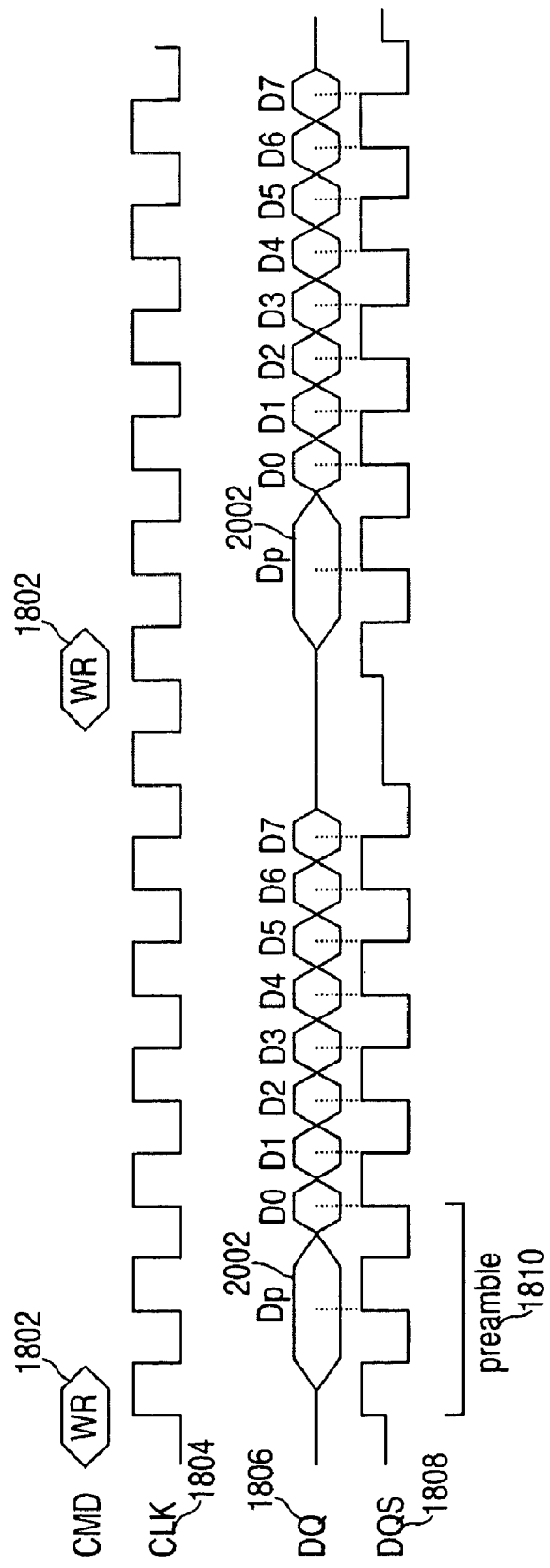
FIG. 20 depicts a timing diagram that may be implemented by an exemplary embodiment during a memory write.

FIG. 20 depicts a timing diagram that can be implemented by a memory device in an exemplary embodiment of the present invention during a memory write to the memory device. As depicted in FIG. 20, the memory device receives parity bit 2002 prior to data strobe 1808 achieving a stable switching state, with the parity bit received during the preamble time 1810. The preamble time 1810 depicted in FIG. 20 takes up to four unit intervals, or two clock cycles (widths). The preamble time 1810 will vary based on factors such as the switching frequency, bus loading, driver strength, termination, net topology, and other factors. The parity bit 2002 is transferred at a slower rate (e.g., consuming three unit intervals) than the data bits (e.g., each consuming one unit interval). Slowing down the transfer rate allows the parity bit 2002 to be captured by the data strobe 1808 before the data strobe 1808 has reached a stable switching state. As depicted in FIG. 20, the previously unused preamble time 1810 (also referred to as "dead time" in relation to the data bus 1806) is now being used to transfer data (in this example, the parity bit 2002, which will add to the integrity of the data transfer as well as utilize a higher percentage of the available data bus bandwidth). The preamble time 1810, and the type of data being transferred during the preamble time 1810 are just examples as other preamble times and data types (e.g. data bits, data mask bits, CRC bits, error detecting code or "EDC" bits, control bits, etc) may be implemented by exemplary embodiments of the present invention.

Figure 21:
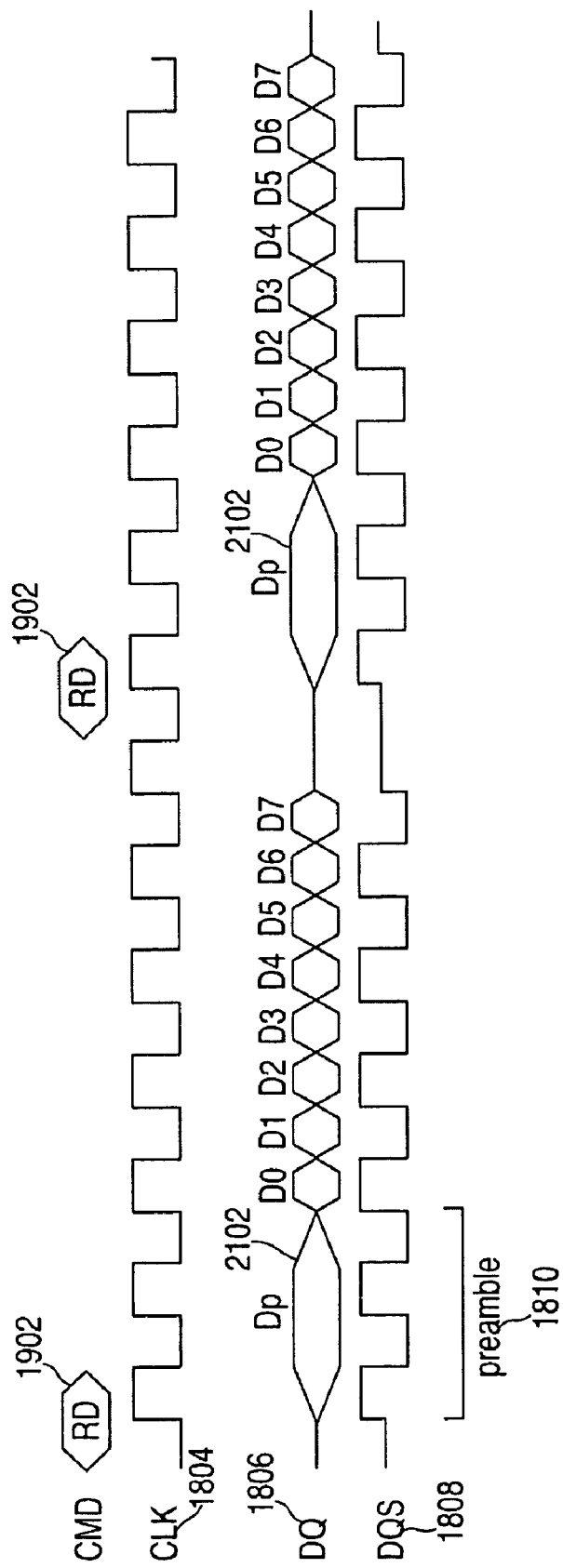
FIG. 21 depicts a timing diagram that may be implemented by an exemplary embodiment during a memory read.

FIG. 21 depicts a timing diagram that can be implemented by a memory device in an exemplary embodiment of the present invention in response to a memory read command. As depicted in FIG. 21, the memory device does not wait until the data strobe 1808 is in a stable switching state and a parity bit 2102 is driven onto bus 1806 during the preamble time 1810. The parity bit 2102 in FIG. 21 is transferred over the four unit intervals that make up the preamble time 1810. The bit(s) that are transferred during the preamble time 1810 are referred to herein as the preamble bits.

Figure 22:
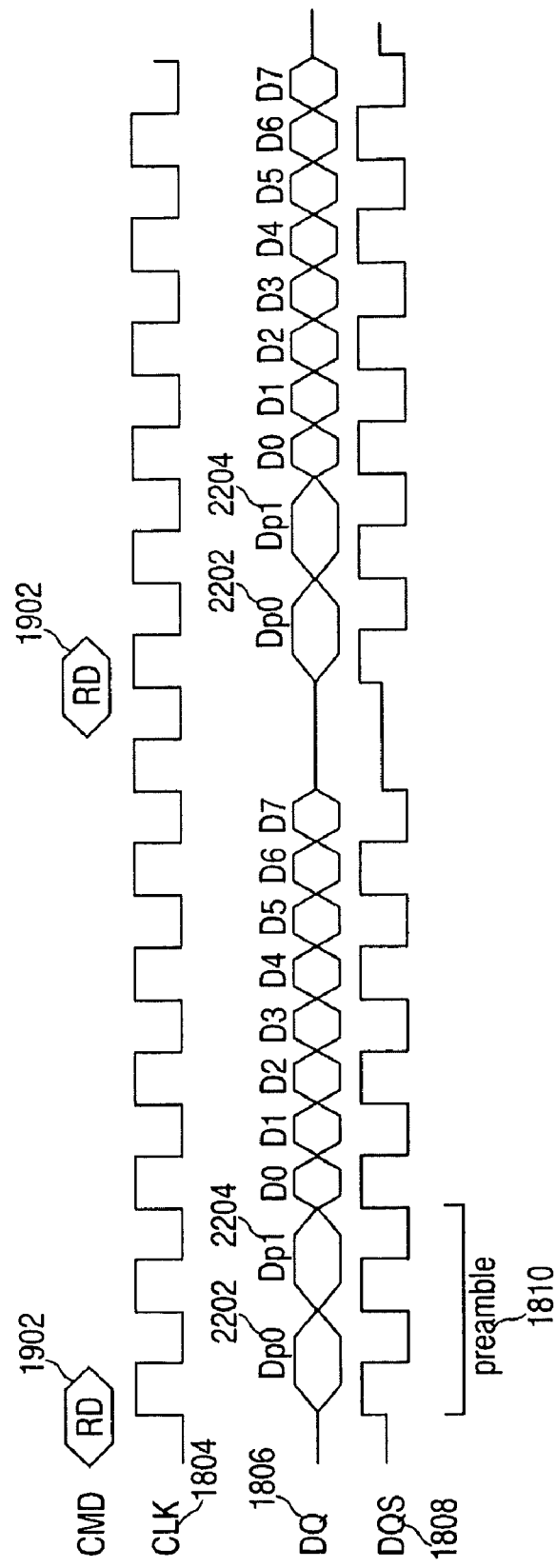
FIG. 22 depicts a timing diagram that may be implemented by an exemplary embodiment during a memory read.

FIG. 22 depicts a timing diagram that can be implemented by a memory device in an alternate exemplary embodiment of the present invention in response to a memory read command. As depicted in FIG. 22, the memory device does not wait until the data strobe 1808 is in a stable switching state and two parity bits: Dp0 2202 and Dp1 2204 are transferred during the preamble time 1810. Each parity bit is transferred over two of the four unit intervals that make up the preamble time 1810. In this manner, two extra bits are transferred (i.e., as the preamble bits). Although FIG. 21 and FIG. 22 show read data transfers starting at a time coinciding with the receipt of the read command, in an alternate exemplary embodiment the read command may precede the strobe preamble time 1810 and the data by one or more unit intervals. In further exemplary embodiments, the data returned during the preamble time 1810 may be sourced by another device sharing the data bus 1806 and data strobe 1808 signals.

Figure 23:
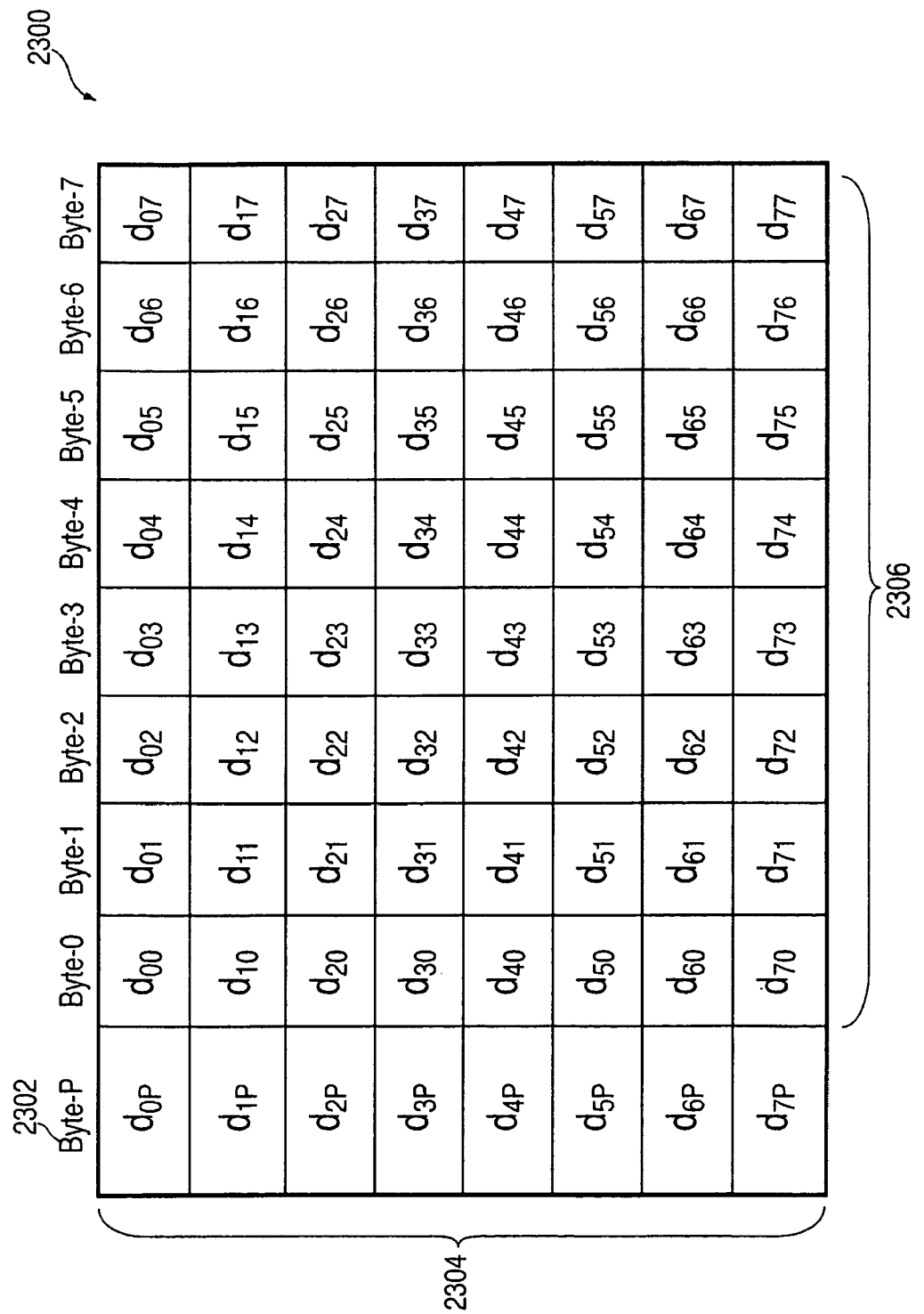
FIG. 23 depicts a memory write format including parity that may be implemented for data writes.

FIG. 23 is a table 2300 that depicts a parity scheme that can be implemented for data writes using exemplary embodiments of the present invention. The rows 2304 in the table 2300 represent data transfers and the columns 2306 represent the bytes (e.g. as related to an 8-bit memory device or two 4-bit memory devices operating in parallel to provide 8 bits of data width) written during each transfer. In an exemplary embodiment, each column represents one transfer to an 8-bit wide memory device operating in a burst length of eight mode, and each row represents a data bit being written to the 8-bit wide memory device. In an exemplary embodiment, the parity byte 2302 is sourced from the memory controller for each 8-byte write operation during the preamble time 1810 as depicted in FIG. 21, with the memory device comparing the received parity with parity generated across the received data to determine if an error has occurred with the data being written. In an exemplary embodiment the parity byte would be compared to the data to be written to the memory device by an intermediate device such as a memory buffer, memory register, memory hub or other device located between the memory controller and the memory device 104 (e.g. on a buffered memory module). In this manner, parity checking of data being written to memory devices from a sourcing device such as a memory controller can be completed without adding any extra time to the write operation.

Figure 24:
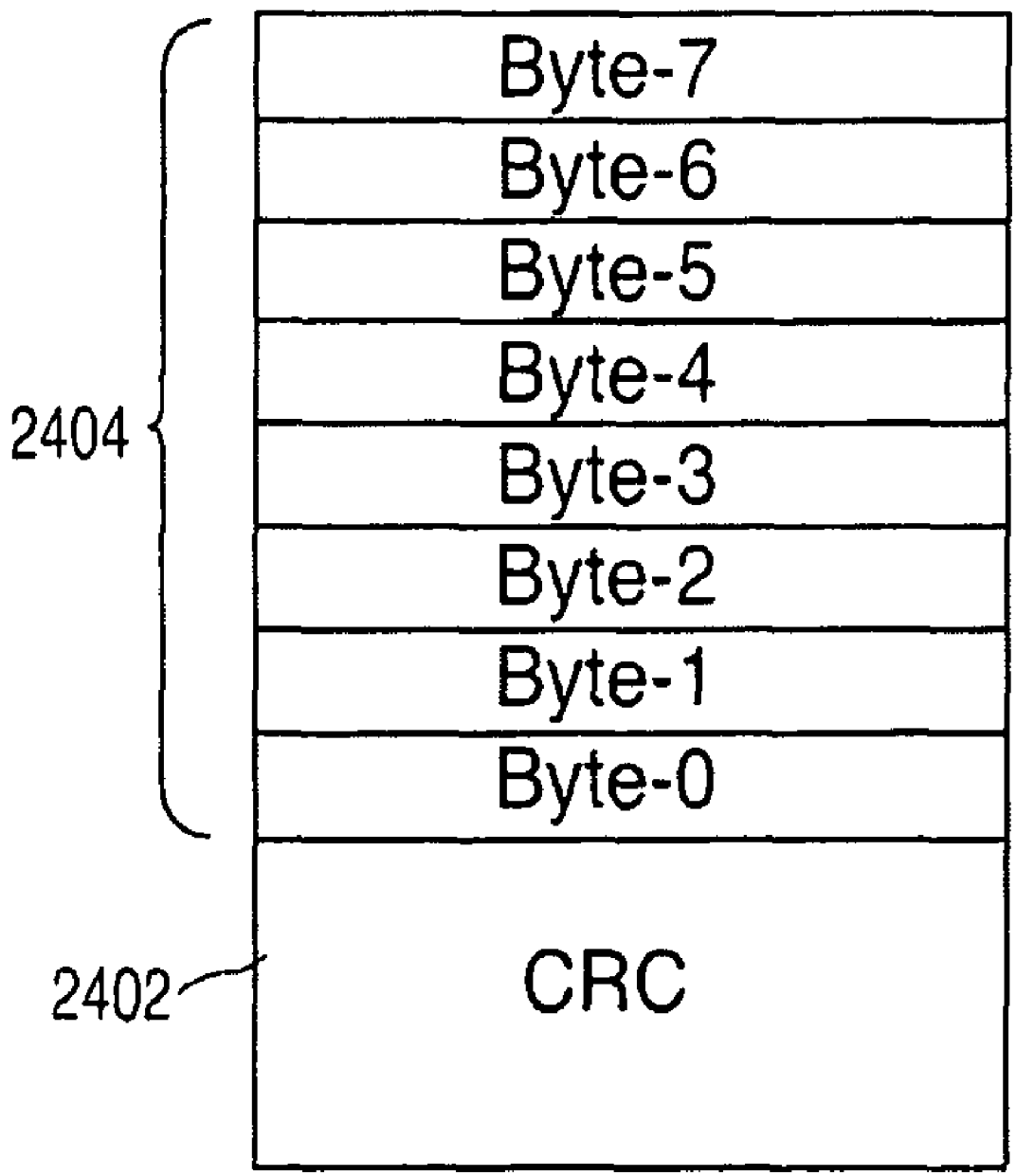
FIG. 24 depicts an exemplary embodiment of a data transfer including cyclical redundancy code (CRC) bits transferred during the preamble time of a data strobe that may be implemented by an exemplary embodiment.

FIG. 24 depicts a way to transfer cyclical redundancy code (CRC) bits 2402 during the preamble time 1810 of the data strobe 1808 using an exemplary embodiment of the present invention. In an exemplary embodiment, the CRC data would be stored in and read from the memory device. In an alternate exemplary embodiment, the memory device would compare the received CRC information to calculated CRC information from the received data during a write operation to determine if an error was present in the received data. As depicted in FIG. 24, the CRC bits are added to and/or included with the data being written to or read from the memory device without incurring any additional cycle time or requiring extra bandwidth on data bus 1806.

Figure 25:
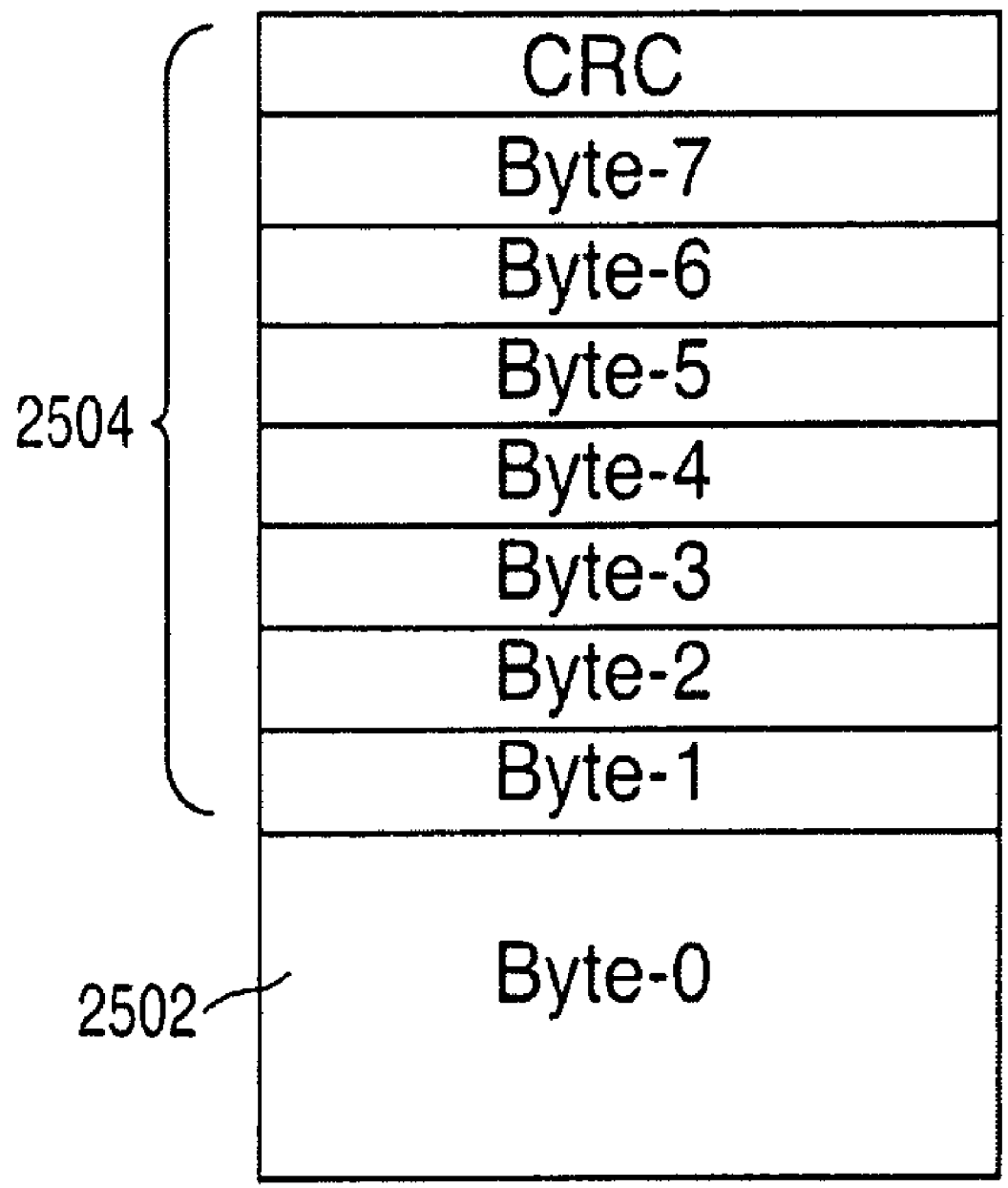
FIG. 25 depicts an exemplary embodiment of a data transfer including cyclical redundancy code (CRC) bits with data byte 0 transferred during the preamble time of a data strobe that may be implemented by an exemplary embodiment.

FIG. 25 depicts an exemplary embodiment where the first data byte 2502 is transferred during the preamble time and a CRC byte is added to the end of the data bytes 2504. In this manner, read data latency may be reduced further because the data can be sent prior to the strobe preamble completion. In an exemplary embodiment, the receiving device (e.g. a memory controller, etc) would forward the initial data read from the memory device (e.g. bytes 0, 1 . . . ) to a processor without first waiting for the CRC information and CRC check result, with the processor further including circuitry to recover from a fault condition identified by a CRC error.

Figure 26:
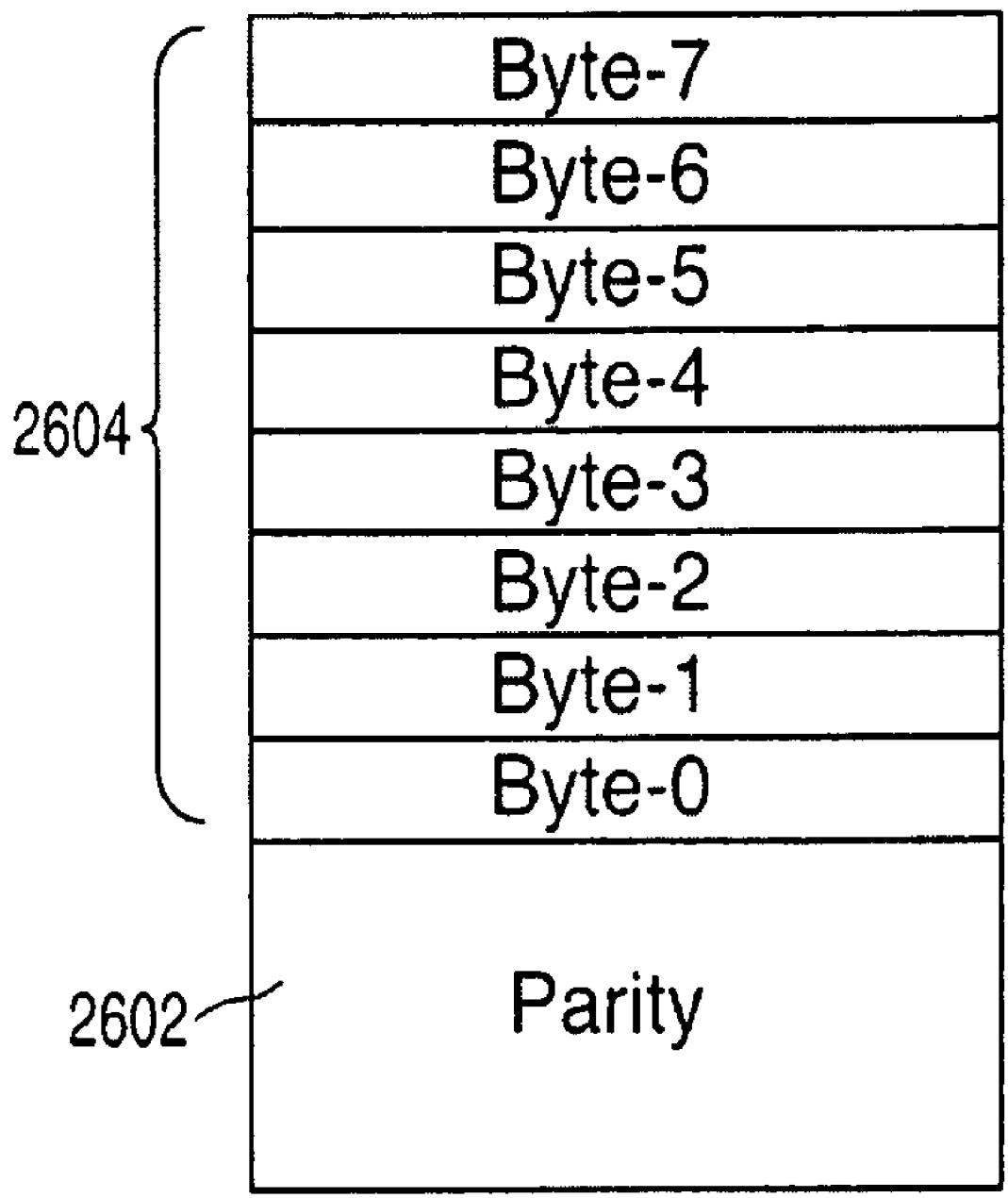
FIG. 26 depicts an exemplary embodiment of a data transfer including parity bits transferred during the preamble time of a data strobe that may be implemented by an exemplary embodiment.

FIG. 26 depicts an exemplary embodiment where parity bits 2602 for data bytes 2604 are transferred during the preamble time 1810 and the parity bits are calculated over either each byte or each bit lane.

Figure 27:
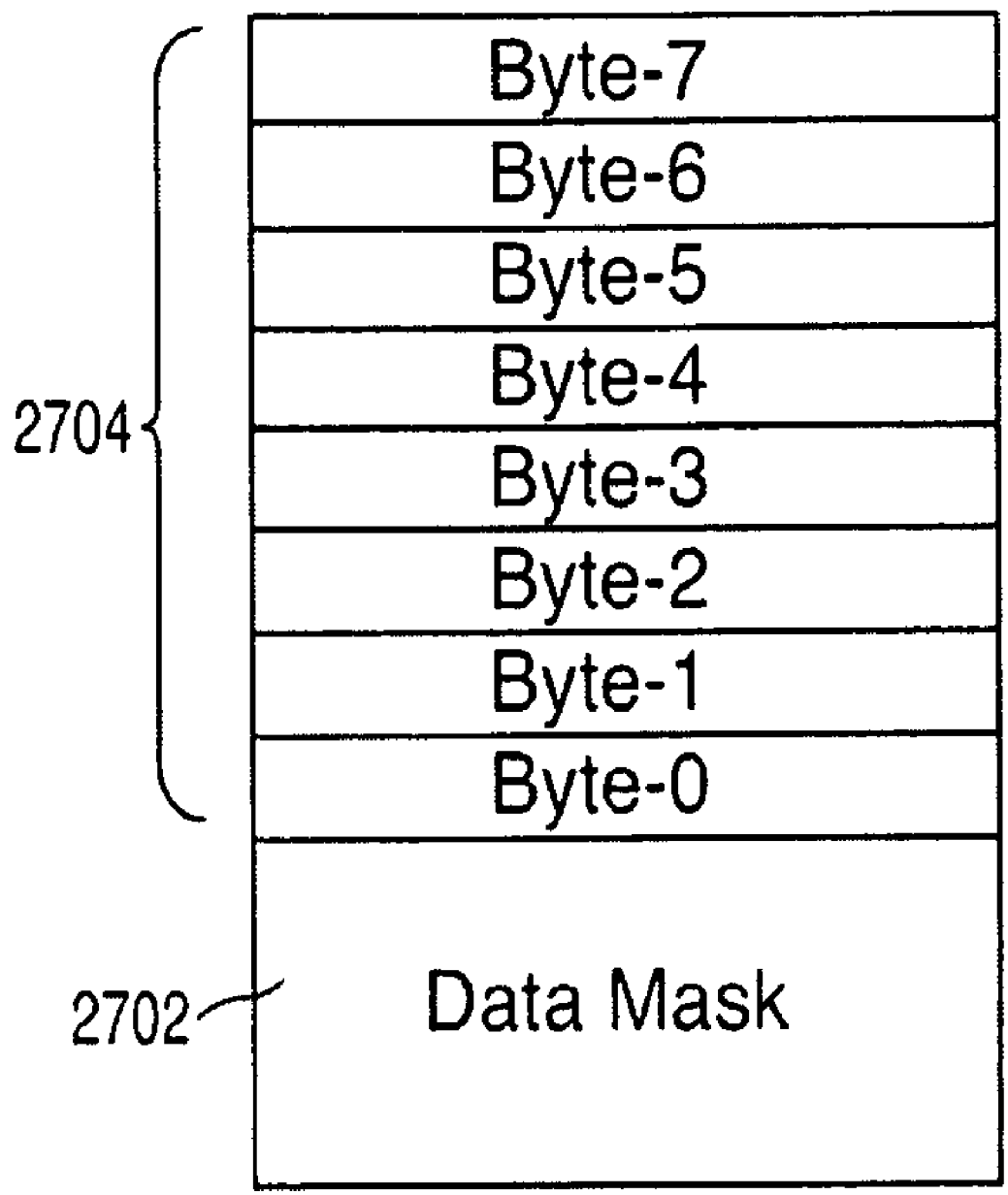
FIG. 27 depicts an exemplary embodiment of a data transfer including data mask bit transferred during the preamble time of a data strobe that may be implemented by an exemplary embodiment.

FIG. 27 depicts an exemplary embodiment where data mask bits 2702 for the data bytes 2704 are transferred during the preamble time 1810 to the memory device during a write operation.

Figure 28:
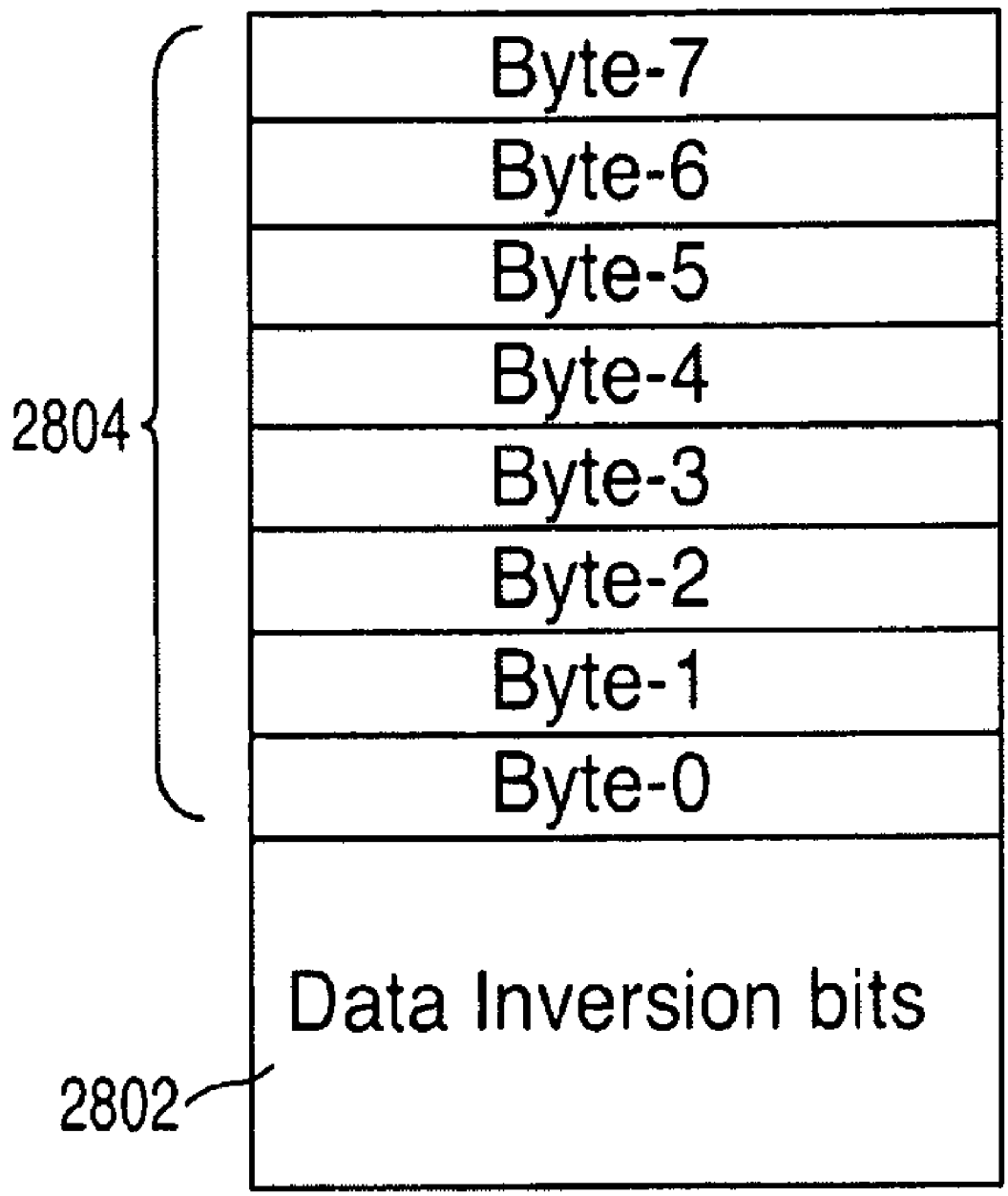
FIG. 28 depicts an exemplary embodiment of a data transfer including data inversion bits transferred during the preamble time of a data strobe that may be implemented by an exemplary embodiment.

FIG. 28 depicts an exemplary embodiment where data inversion bits 2802 (e.g., to ensure periodic data switching on the data bus) for the data bytes 2804 are transferred, during the preamble time 1810, for read or write operations.

Figure 29:
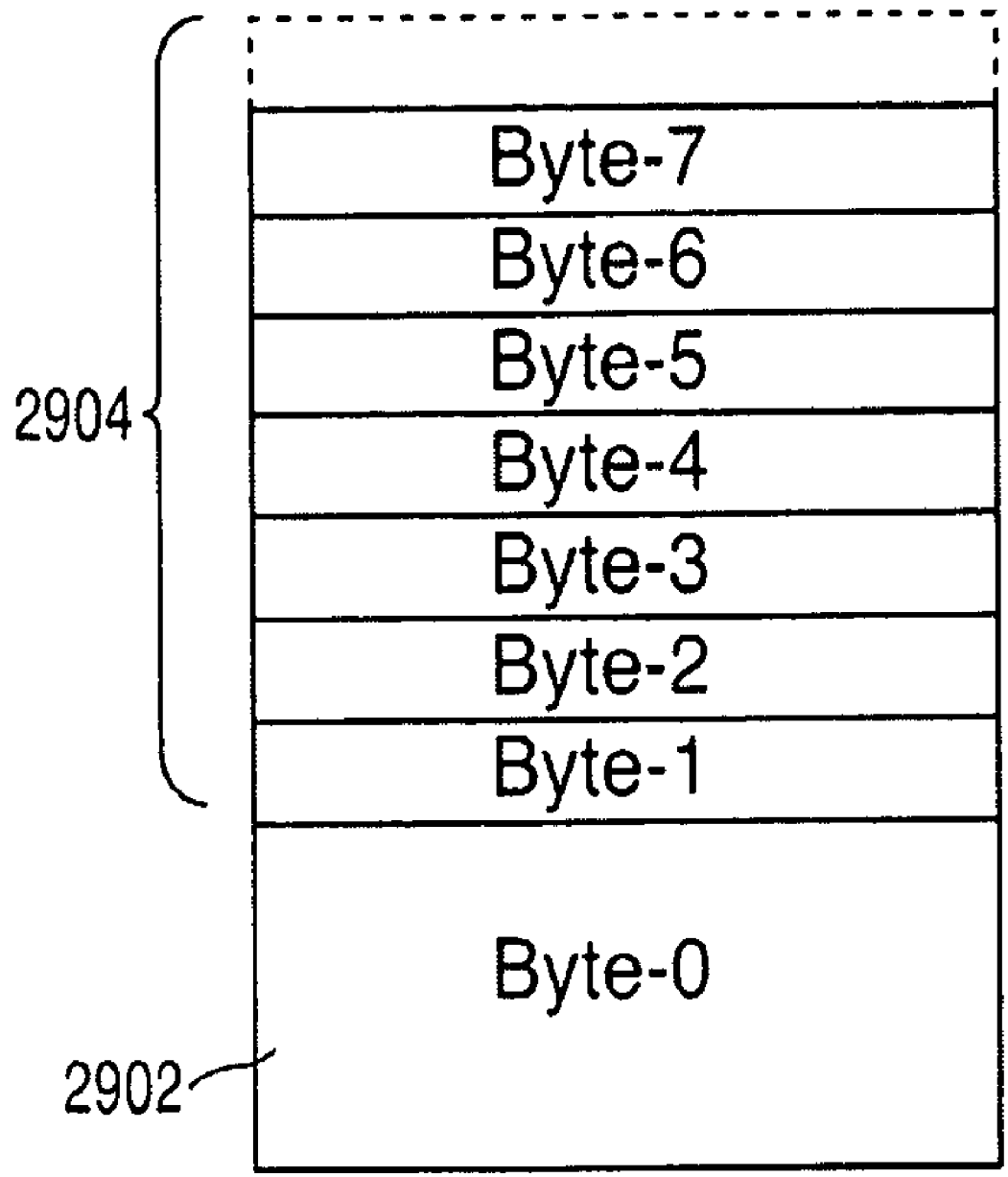
FIG. 29 depicts an exemplary embodiment of a data transfer during the preamble time of a data strobe that may be implemented by an exemplary embodiment.
Figure 30:
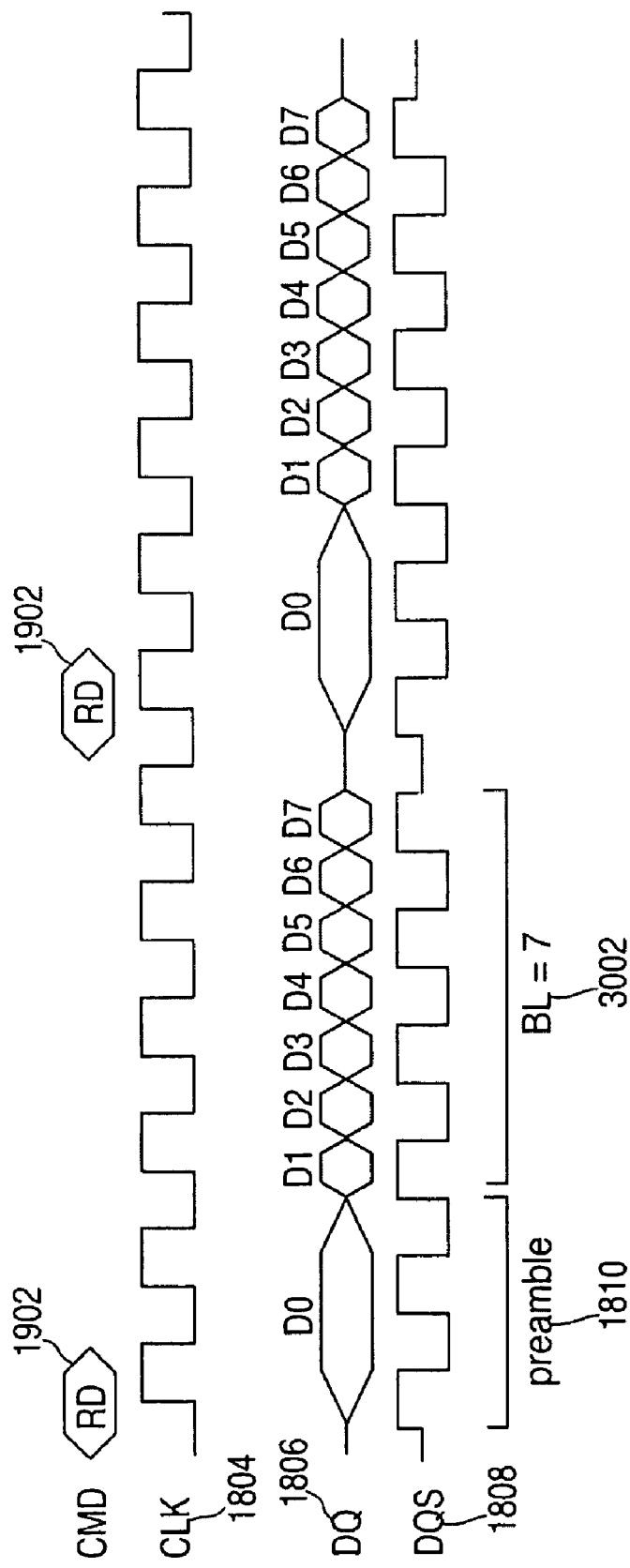
FIG. 30 depicts a read timing diagram that may be implemented by an exemplary embodiment that transfers data during the preamble time of a data strobe.
Figure 31:
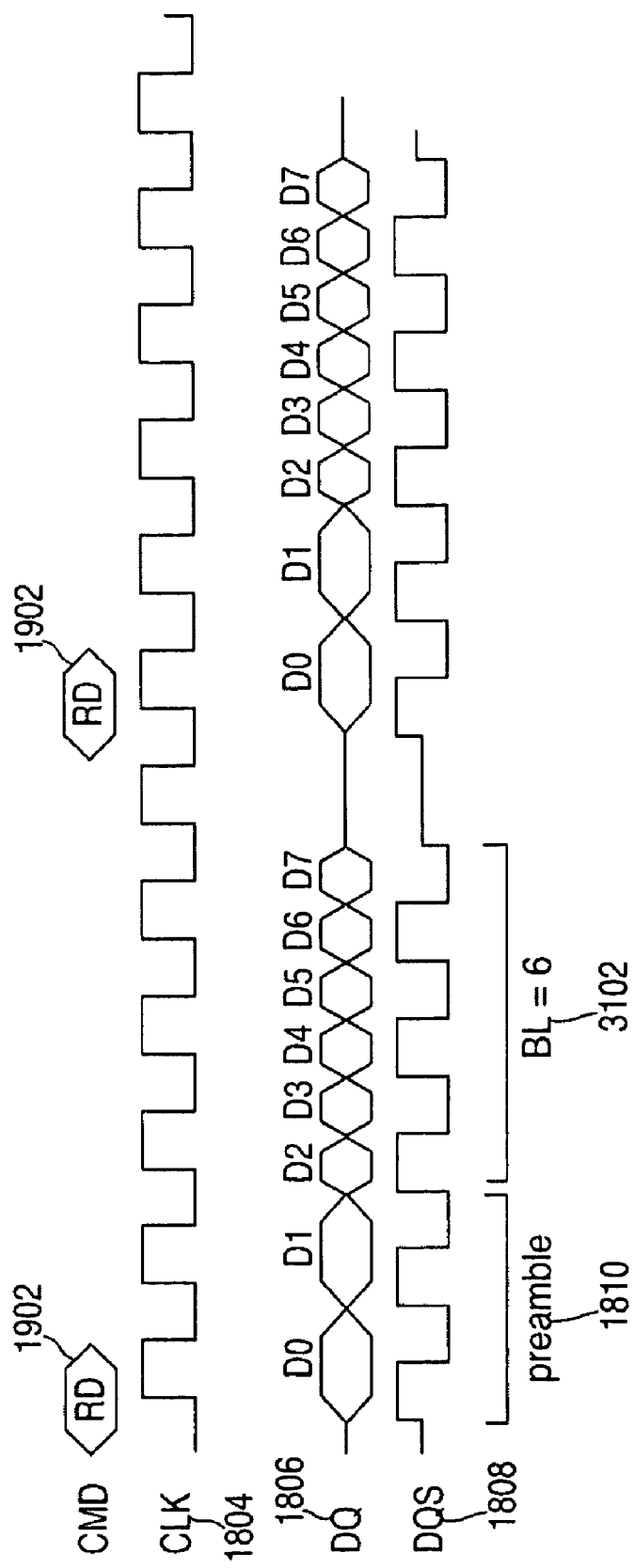
FIG. 31 depicts a read timing diagram that may be implemented by an exemplary embodiment that transfers data during the preamble time of a data strobe.

FIG. 29 depicts an exemplary embodiment where a first data byte 2902 is transferred during the preamble time 1810 thereby enabling the burst length for data byte transfers 2904 to be reduced by one, while retaining the same amount of data bits transferred (e.g. 8 bits of data width×8 bytes=64 data bits). In this embodiment, the burst length is reduced by one transfer to a burst length of seven. An exemplary timing diagram associated with this embodiment, showing the burst length being reduced to seven 3002 is depicted in FIG. 30. In this diagram, preamble 1810 comprises the additional transfer, resulting in a total of 8 transfers (e.g. a burst of 8) in the time normally required for 7 transfers (e.g. the time shown in 3002 of FIG. 30). FIG. 31 depicts an embodiment where the first two data bytes (each byte being 2 unit intervals in width) are read during the preamble time 1810 resulting in an effective burst length of six 3102. This results in a savings of two unit intervals per burst of 8 transfers. Although read operations are depicted in FIGS. 30 and 31, write operations would operate in a similar manner although the timing relationships (e.g. one or more of clock-to-strobe, data-vs.-strobe, command to data latency, etc) may change. In addition, a memory device may be operable wherein a subset of information sent to a memory device could be transferred during the preamble time preceding a first burst operation (e.g. BL=6 3102) and all information sent to a memory device could be transferred during the burst time (e.g. BL=8) for a second burst operation when the second burst is not preceded by a preamble time (e.g. when data bursts are sent back-to-back to a memory device, with no preamble required for the strobe associated with the second data burst, since the strobe may already be in a stable switching state).

Other aspects of exemplary embodiments of the present invention relate to providing more seamless transitions between states in a memory device by using a serialized clock enable (CKE) signal for power state transition control.

Figure 32:
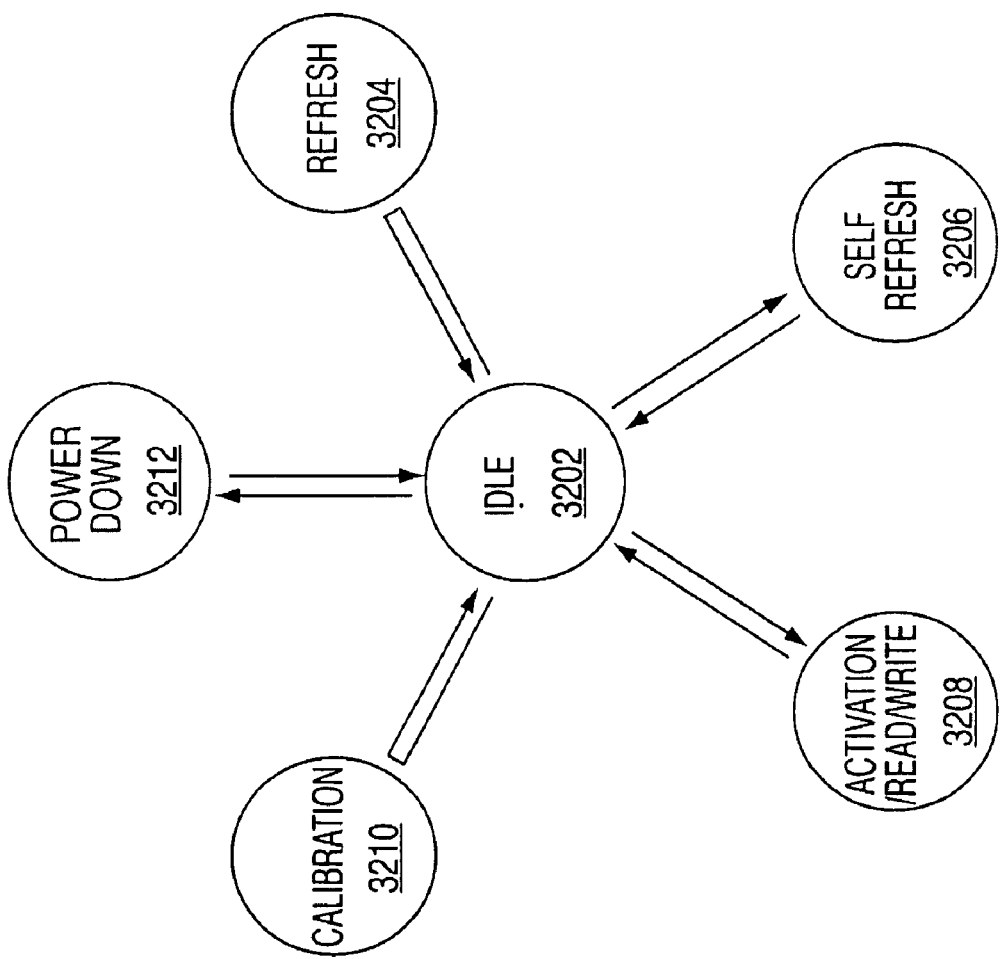
FIG. 32 depicts a state diagram for a memory device.

FIG. 32 depicts an exemplary state diagram for a memory device. The calibration state 3210, power-down state 3212, refresh state 3204, self-refresh state 3206 and activation/read/write state 3208 all transition through the idle state. As shown in FIG. 32, in order for a memory device in a power-down state 3212 to be refreshed, several transitions must occur. First the memory device must be transitioned from the power down state 3212 to the idle state 3202, then from the idle state 3202 to the refresh state 3204 to the idle state 3202 and then transitioned back to the power-down state 3212. It would be advantageous to be able to move between these states in a more efficient manner, with less command bus utilization to initiate the state transitions.

FIG. 33 depicts a command truth table 3300 that may be implemented by a memory device for moving between the states depicted in FIG. 32. The table 3300 includes a function column 3302 that describes the various states or functions that may be performed by the memory device. The CKE control column 3304, CMD pins column 3306, and ADDR pins column 3308 list the transitions and/or values of each these pins in order to activate a corresponding function—often determined in relation to a clock edge such as a rising clock edge. For example, in order to enter refresh mode, the CKE is must be high, the command pins (e.g. #CS, #RAS, #CAS, #WE) must contain the values "LLLH" and the values on the address pins don't matter.

Figure 34:
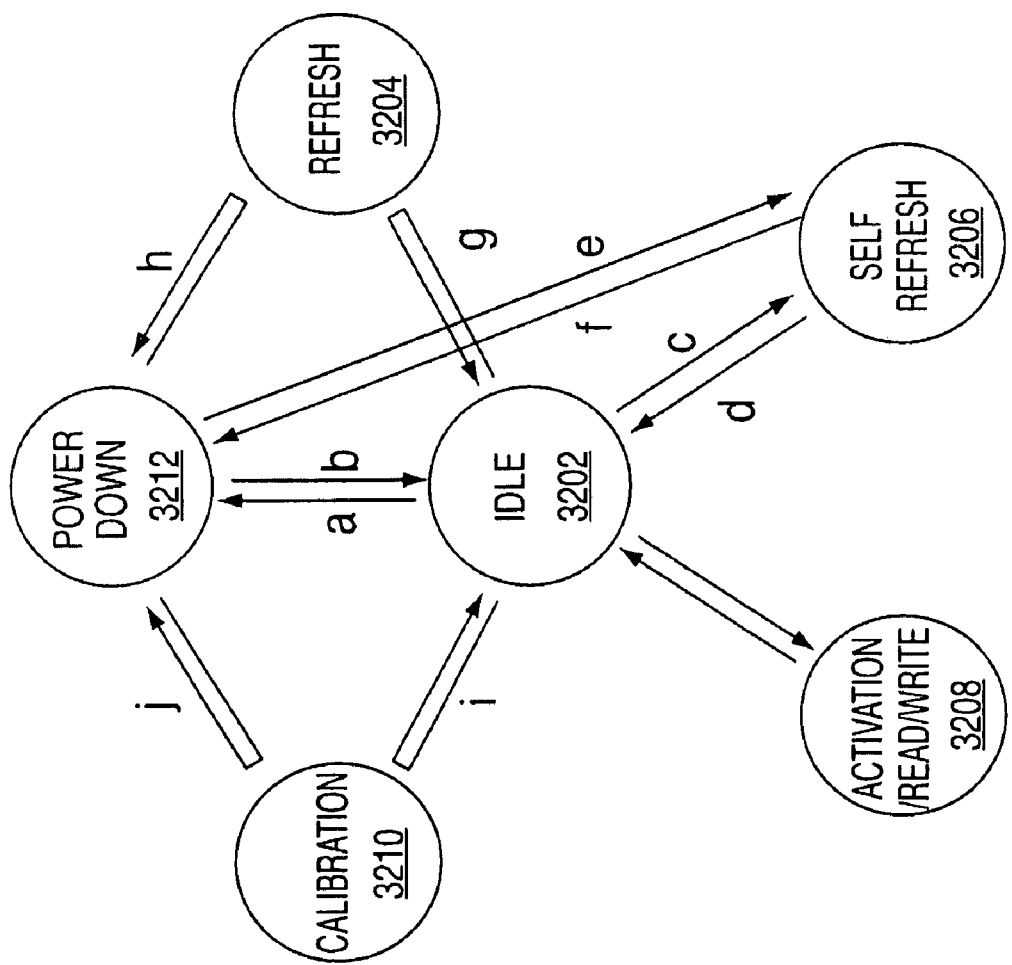
FIG. 34 depicts a state diagram for a memory device that may be implemented by an exemplary embodiment.

FIG. 34 depicts a state diagram that may be implemented by an exemplary embodiment of the present invention, allowing movement between the states in a new and more efficient manner. This is accomplished without adding new pins to the memory device—which will result in reduced command bandwidth and may result in reduced power consumption. As shown in FIG. 34, direct transitions can be made from the power down state 3212 to the calibration state 3210 (e.g. to complete periodic re-calibration of the memory interface) and back to the power down state 3212, without the need to first exit the power-down state 3212, receive a command to complete a periodic re-calibration (idle state 3202->calibration state 3210->idle state 3202) then receive a command decode (e.g. LHHH) and high-to-low transition on CKE to return to the power-down state 3212. Similar transitions may also be made between the power-down state 3212 and the refresh state 3204—returning the memory device to the power-down state 3212 upon completion of the refresh as shown by the arrow "h". In addition, a transition in either direction may be made directly between the power down state 3212 and the self refresh state 3206 as shown by arrows "e" and "f".

FIG. 35 depicts a command truth table 3500 that may be implemented by a memory device implementing an exemplary embodiment of the present invention for moving between the states depicted in FIG. 34. The table 3500 includes a function column 3502 that describes the various states or functions that may be performed by the memory device. The CKE control column 3504, CMD pins column 3506, and ADDR pins column 3508 list the values and/or transitions of each these pins in order to activate a corresponding function. As shown in FIG. 35, the new state transitions are supported by using the CKE control pin (typically switched from one signal level to another and maintained at the new signal level for at least a specified minimum number of clock cycles) in a backward-compatible/serialized manner. For example, the memory device moves from the power down state 3212 to the self refresh state 3206 when the CKE signal goes from a low state to a high state to a low state to a high state and back to a low state. The CKE signal starts low and ends low in order to be backwards compatible with existing memory devices. The values shown in the table 3500 are intended be examples of one manner of indicating movement from one state to another—other state transitions are possible while using the CKE signal in a serialized manner with or without command pin decodes.

Figure 36:
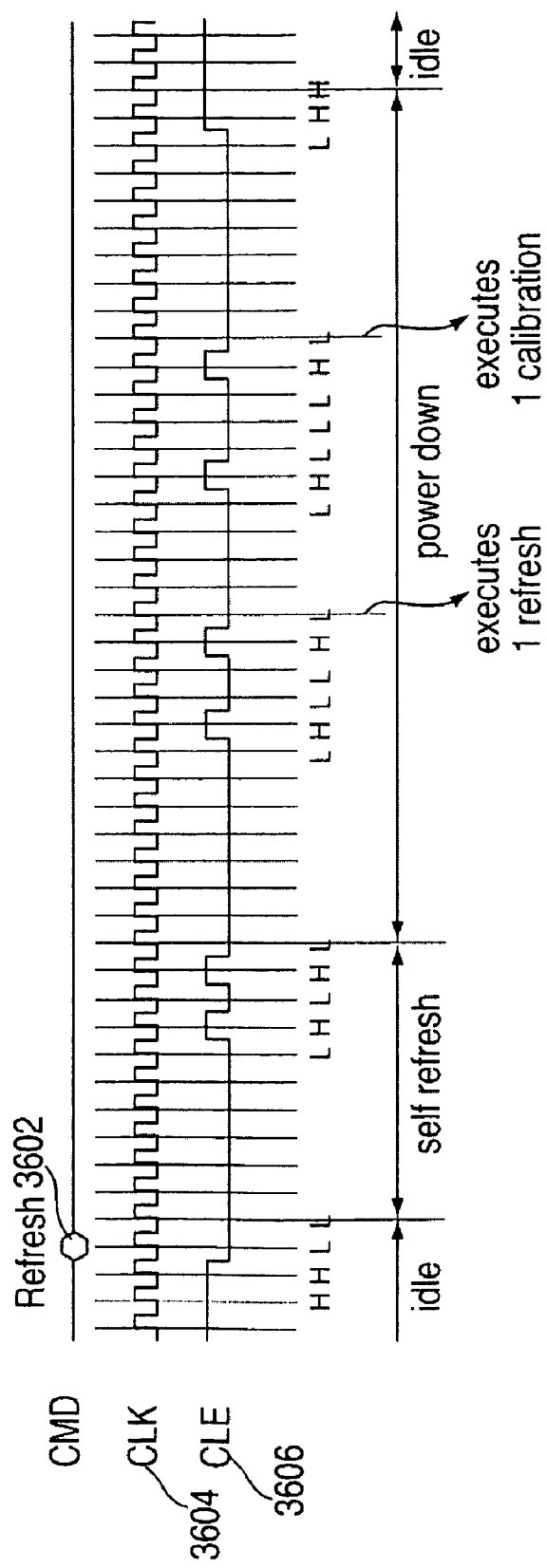
FIG. 36 depicts a timing diagram that may be implemented by an exemplary embodiment.

FIG. 36 illustrates a timing diagram that may be implemented by exemplary embodiments of the present invention as depicted in FIGS. 34-36. The timing diagram includes a clock signal 3604 and the CKE signal 3606. As shown in FIG. 36, the serialized value of the CKE signal 3606 moves the memory device among various states. As depicted in FIG. 36, the memory device starts in an idle state, then receives a self-refresh entry command 3602 as indicated by the CKE signal 3606 moving from a high to a low level with a command decode of "LLLH" applied prior to the rising edge of clock. This reflects path "c" in FIG. 34. At a later time (with a minimum time period likely established by the memory device specification), a CKE serial pattern of "LHLHL" is received by the memory device which moves the state along path "f" in FIG. 34 from the self refresh state 3206 to the power down state 3212. This is later followed by a CKE pattern of "LHLLHL" which moves along path "h" from the power down state 3212 to the refresh state 3204 and back to the power down state, thereby completing a refresh of the memory device and returning the device to the power-down state 3212, without use of the command bus. Next, a CKE serial pattern of "LHLLLHL" is received. This causes the memory device to follow path "k" in FIG. 34 from the power down state 3212 to the calibration state 3210 and back to the power down state 3212—again without the use of the command bus. The last operation in FIG. 36 results from a CKE pattern of "LHH" which causes the memory device to follow path "b" to move from power-down state 3212 to the idle state 3202.

An exemplary embodiment of the present invention is directed to reducing the page size of an array within a memory device without requiring more row decoders. Instead of splitting the array and adding another full set of row decoders, exemplary embodiments activate only half of a word-line within an array by selectively activating sub-word-line drivers. In addition, in exemplary embodiments, only half of the sense amplifiers are selectively activated, this is implemented by having separate sense amplifier enable signals. However, sub-word-line drivers are usually shared by two adjacent blocks in most memory architectures, and they are staggered to relax the word-line driver pitch compared to the word-line pitch. Therefore, a memory array mat (or a bank) cannot be physically divided in half due to the shared sub-word-line drivers at the boundary. Exemplary embodiments described herein allow the mat to be logically divided in half without requiring additional row decoders.

Figure 37:
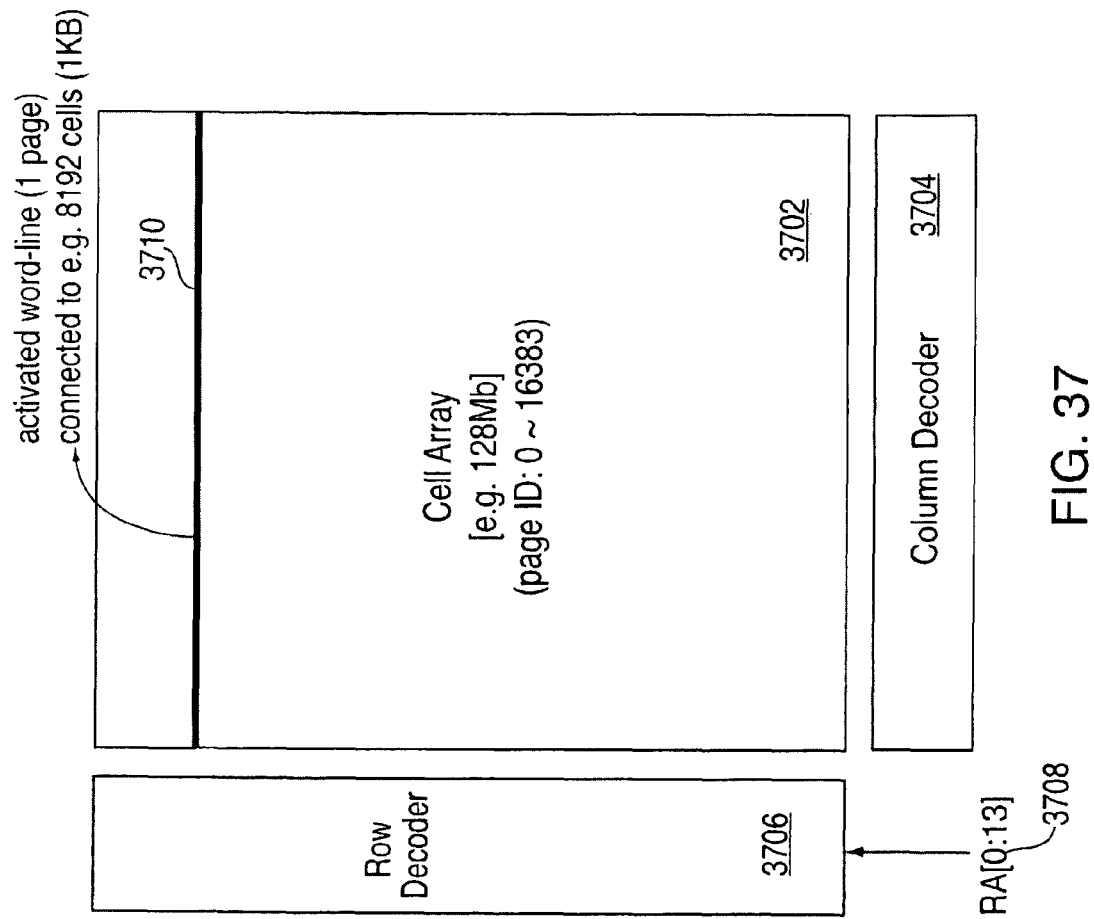
FIG. 37 depicts a portion of a memory device that includes one cell array in which a 1 KB page is activated.

FIG. 37 depicts a full page array architecture in a memory device that includes a cell array 3702 with over 128 million cells (e.g. 128 Mb). In the example depicted in FIG. 37 the row decoder 3706 receives a fourteen bit row address 3708 that is used to activate one of the 16,384 (i.e., $2^{14}$) rows in the cell array 3702. The activated row is referred to as a "page" or an "activated word line" 3710. In this example the activated word-line 3710 contains 8,192 (i.e., $2^{13}$) cells (e.g. 1 KB), the contents of which will be transferred to sense amplifiers in response to activating the word-line 3710. FIG. 37 also includes a column decoder 3704 that is used to select a bit from the activated word-line 3710.

Figure 38:
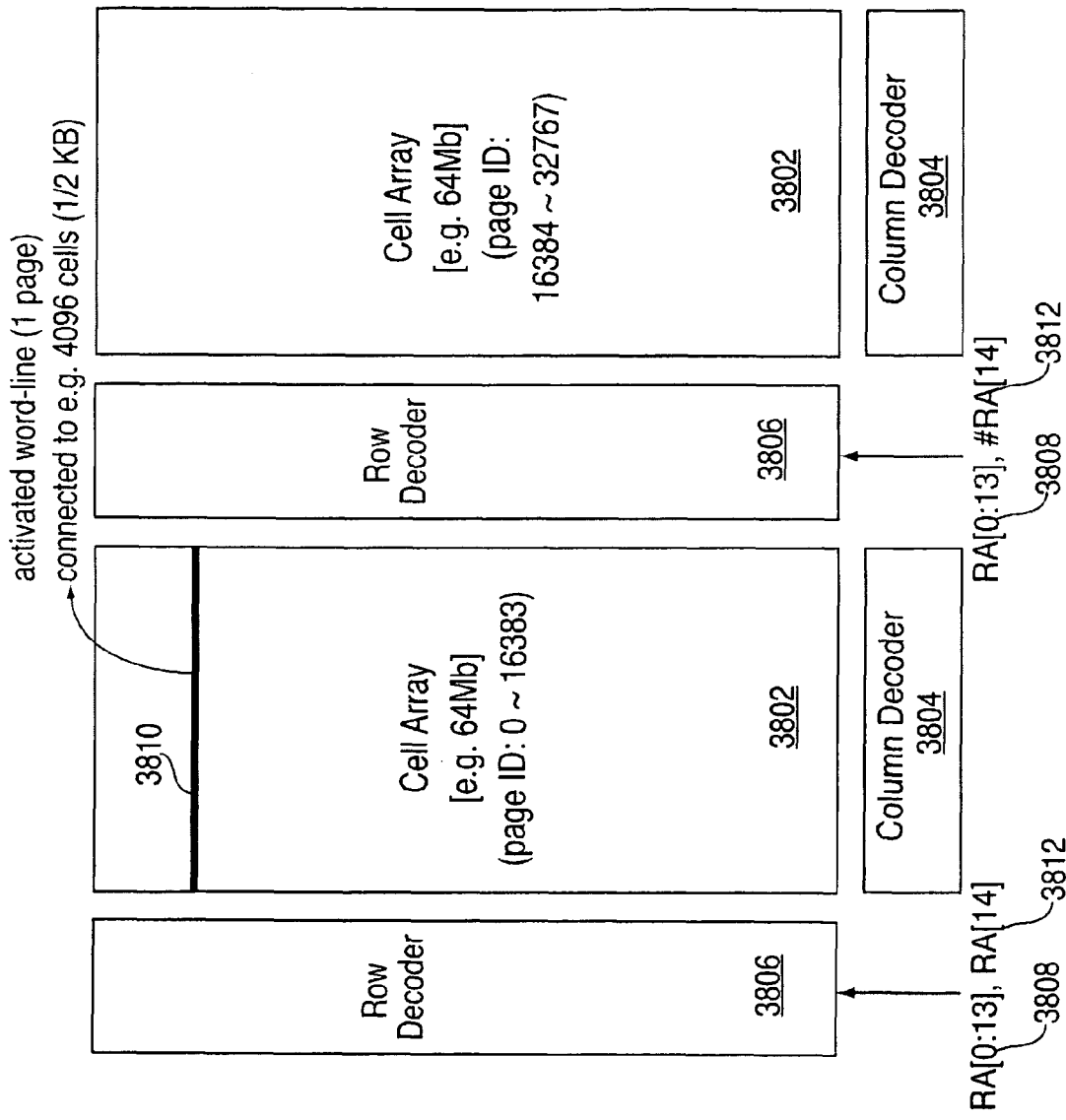
FIG. 38 depicts a portion of a memory device that includes two cell arrays in which a 0.5 KB page is activated in one cell array.
Figure 39:
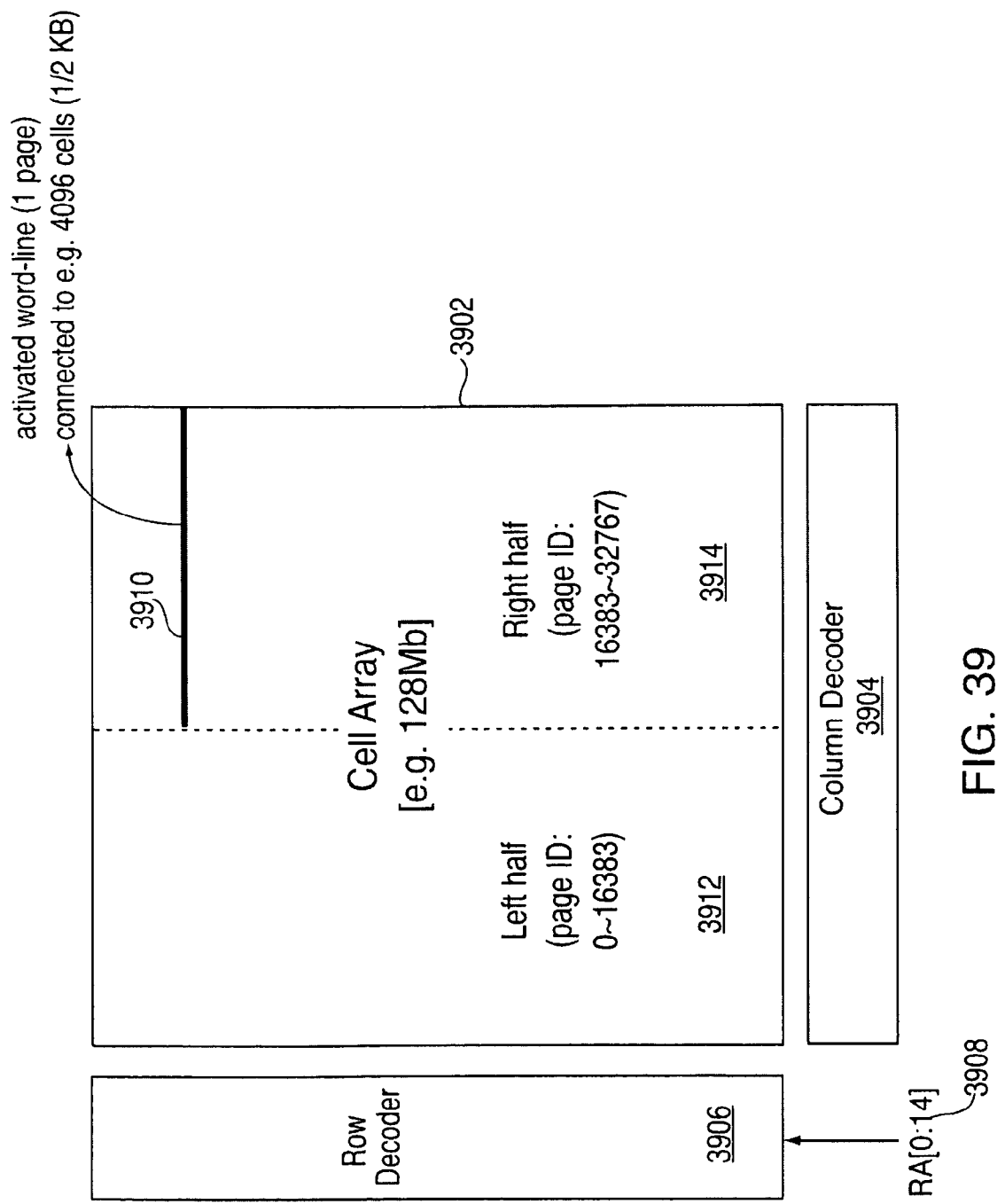
FIG. 39 depicts a portion of a memory device that includes one cell array in which a 0.5 KB page is activated that may be implemented by exemplary embodiments.

FIG. 38 depicts an array in a memory device that includes two cell arrays 3802 each with over 64 million cells (e.g. 64 Mb). FIG. 38 takes the cell array 3702 in FIG. 37 and breaks it into two cell arrays 3802. This reduces the size of the activated word-line 3810 to 4,096 cells (e.g. ½ KB or 512 B) but requires the use of two row decoders 3806. In the example depicted in FIG. 38, each of the decoders 3806 receives a fourteen bit row address 3808 that is used to activate one of the 16,384 (i.e., $2^{14}$) rows in the cell array 3802. In addition, each row decoder 3806 also receives a cell array selector signal 3812 (e.g. RA[14] or #RA[14]) to select between the two cell arrays 3802. In the example depicted in FIG. 38, the cell selector signal 3812 selected the cell array on the left as shown by the activated ½ KB word-line 3810. FIG. 38 also includes a column decoder 3804 that is used to select a cell within the activated word-line 3810. Using two row decoders 3806 adds overhead (e.g., space, power consumption, etc) to the cell arrays comprising the memory device further resulting in a larger die size and higher cost. A benefit to using two row decoders 3806 is that the reduction in the page size from 8,192 cells to 4,096 cells reduces memory power. The memory device chip size would be increased in FIG. 38 compared to FIG. 37 because the embodiment in FIG. 38 requires twice as many row decoders FIG. 39 depicts a 128 Mb cell array in a memory device that may be implemented by exemplary embodiments of the present invention. The embodiment depicted in FIG. 39 reduces the page size without requiring an additional row decoder. It includes a single cell array 3902 logically divided up into a left half array 3912 and right half array 3914, each being 64 Mb in size. In the example depicted in FIG. 39 the row decoder 3906 receives a row address 3908 that includes fourteen bits to activate one of the 16,384 (i.e., $2^{14}$) rows in the cell array 3902 and one bit to select between the left half array 3912 and the right half array 3914. In the example depicted in FIG. 39, the right half array 3910 was selected as shown by the activated word-line 3910 which has a page size of 4,096 cells (e.g. ½ KB).

Figure 40:
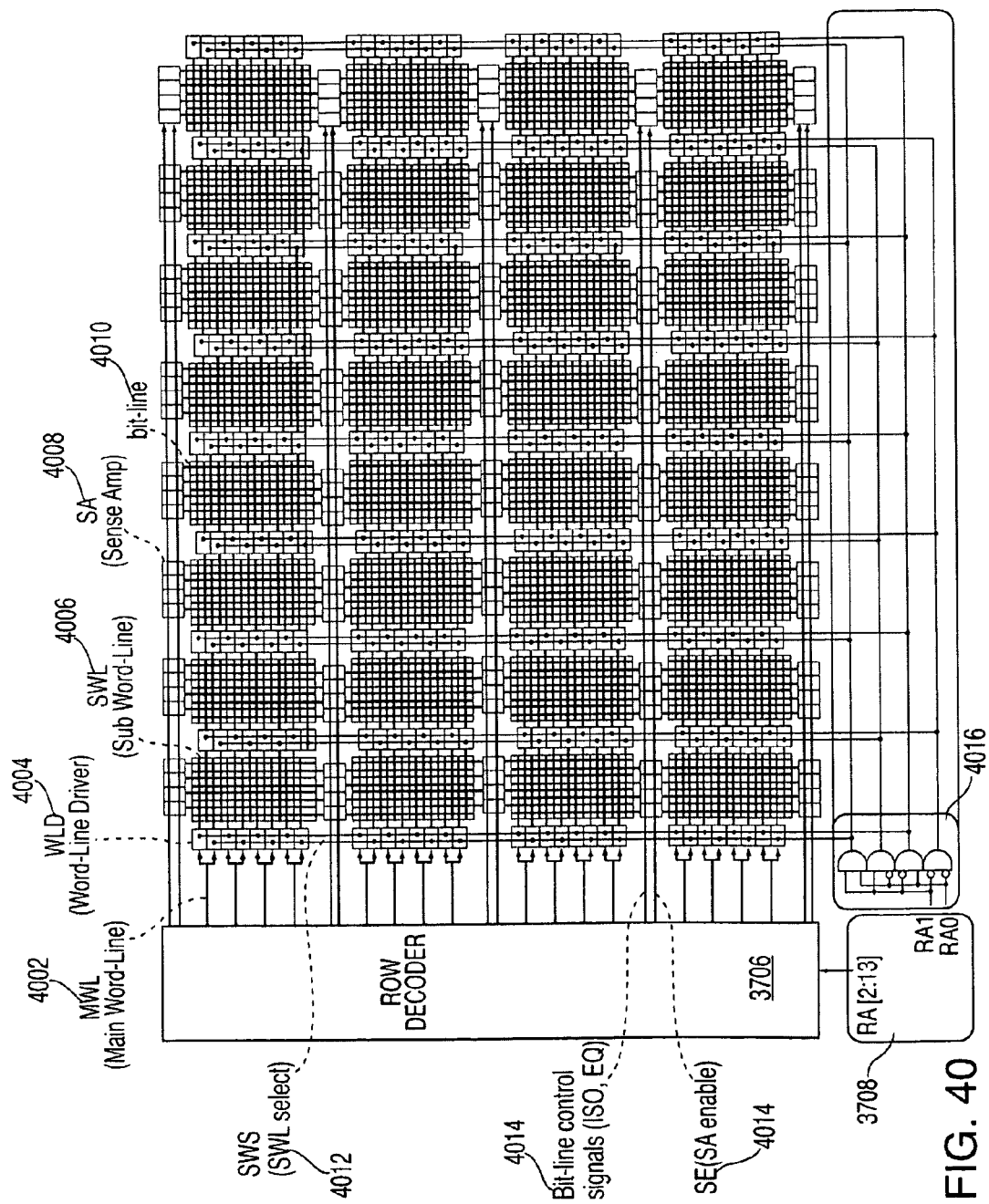
FIG. 40 depicts a more detailed view of the array depicted in FIG. 37.

FIG. 40 depicts the array shown in FIG. 37 in more detail. In an exemplary embodiment, the cell array 3702 depicted in FIG. 37 is part of a larger array that has been logically broken up into sub-arrays. For example, a contemporary memory device may have in excess of one billion cells (e.g. 1 Gb). In one embodiment, this could require a matrix of 32K rows by 32K columns, resulting in a word-line length (or row width) of 32K—which would result a memory device having slow performance and a very large page size. In order to reduce the word-line length and correspondingly reduce the page size, the matrix is typically segmented into 16 arrays, each having 64 MB of cells each having 8K rows and 8K columns, resulting in a word-line length of 8K as depicted in FIG. 37. As depicted in FIG. 40, each array can be further segmented into 32 sub-arrays. In other exemplary embodiments, each array is further segmented into 256 or 1,024 sub-arrays.

FIG. 40 depicts a main word line (MWL) 4002 that is driven by a main row decoder for the matrix to select a row across the entire matrix. The MWL 4002 is input to word line drivers 4004 that drive 32 sub-word-line (SWL) decoders 4006 (one for each of the sub-arrays depicted in FIG. 40). FIG. 40 also includes sense amplifiers (SAs) 4008 that store the activated data, and bit-lines 4010 for moving specific cells to the sense amplifiers 4008. The SWL select (SWS) lines 4012 are used for word line selection (e.g., between two candidates) in response to the first two bits in the row address 3708. This selection is performed in response to values of the first two bits and to the "and" gate circuitry 4016. FIG. 40 also includes bit-line control signals 4014 for selection of data bits to be transferred to I/Os out of total activated data in response to the column address signals and SA enable signals 4014 for turning on the corresponding SAs.

Figure 41:
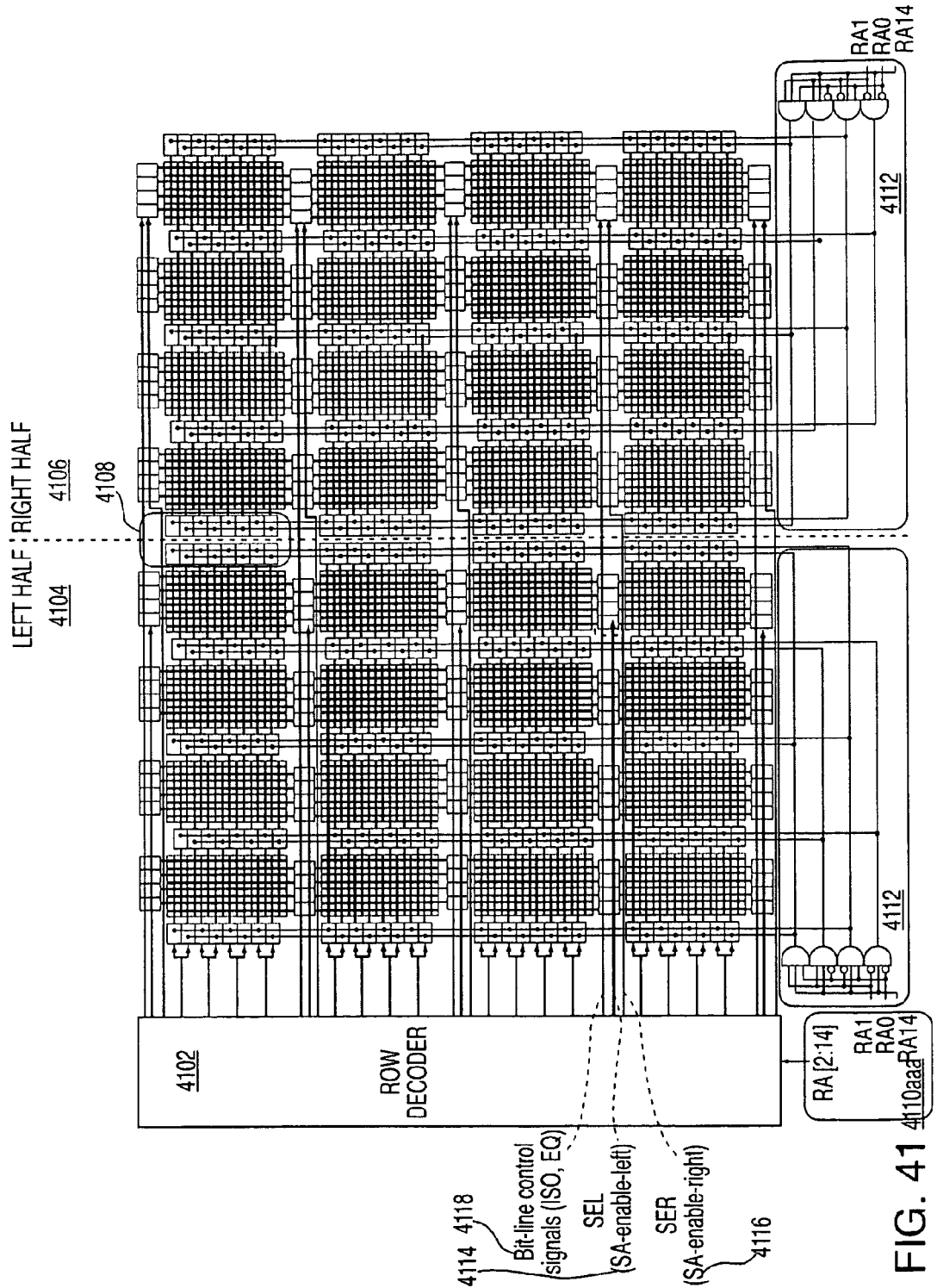
FIG. 41 depicts a detailed view of an array architecture in a memory device that may be implemented by exemplary embodiments.

FIG. 41 depicts details of an exemplary embodiment of a memory device that may be utilized to implement the array depicted in FIG. 39. FIG. 41 depicts a left half of the array 4104, a right half of the array 4106, a row decoder 4102, and bit-line control signals 4118. When compared to FIG. 40, FIG. 41 includes an extra set of sub-word line decoders 4108, a SA-enable left (SEL) signal 4114 and a SA-enable-right (SER) signal 4116. This allows either the activated word line to refer to include bits in either the left half of the array 4104 or the right half of the array 4106 depending on the value of the "RA14" in the row address 4110. When compared to FIG. 40, the implementation depicted in FIG. 41 also requires an additional bit in the row address 4110 and an extra set of sub-word line select circuitry 4112.

As depicted in the exemplary embodiment of the present invention depicted in FIG. 41, sub-word line decoders 4108 in the center are duplicated and each one is used only on one half of the array. This allows the total array mat be divided into left and right sections. The contents of the RA14 bit in the row address 4110 is used to distinguish between sub-word lines in the left half of the array 4104 and the right half of the array 4106. Further, two separate SA enable signals (SEL 4114 and SER 4116) are provided from the row decoder 4102 to selectively activate SAs in either the left half of the array 4104 or the right half of the array 4106. All other SA control signals are shared between the left half of the array 4104 and the right half of the array 4106 to avoid an increase in area. This is possible because, the operation of those SAs in the inactivated section (as determined by the value of the RA14 bit) is don't care because the cell's word-lines are shut down.

Figure 42:
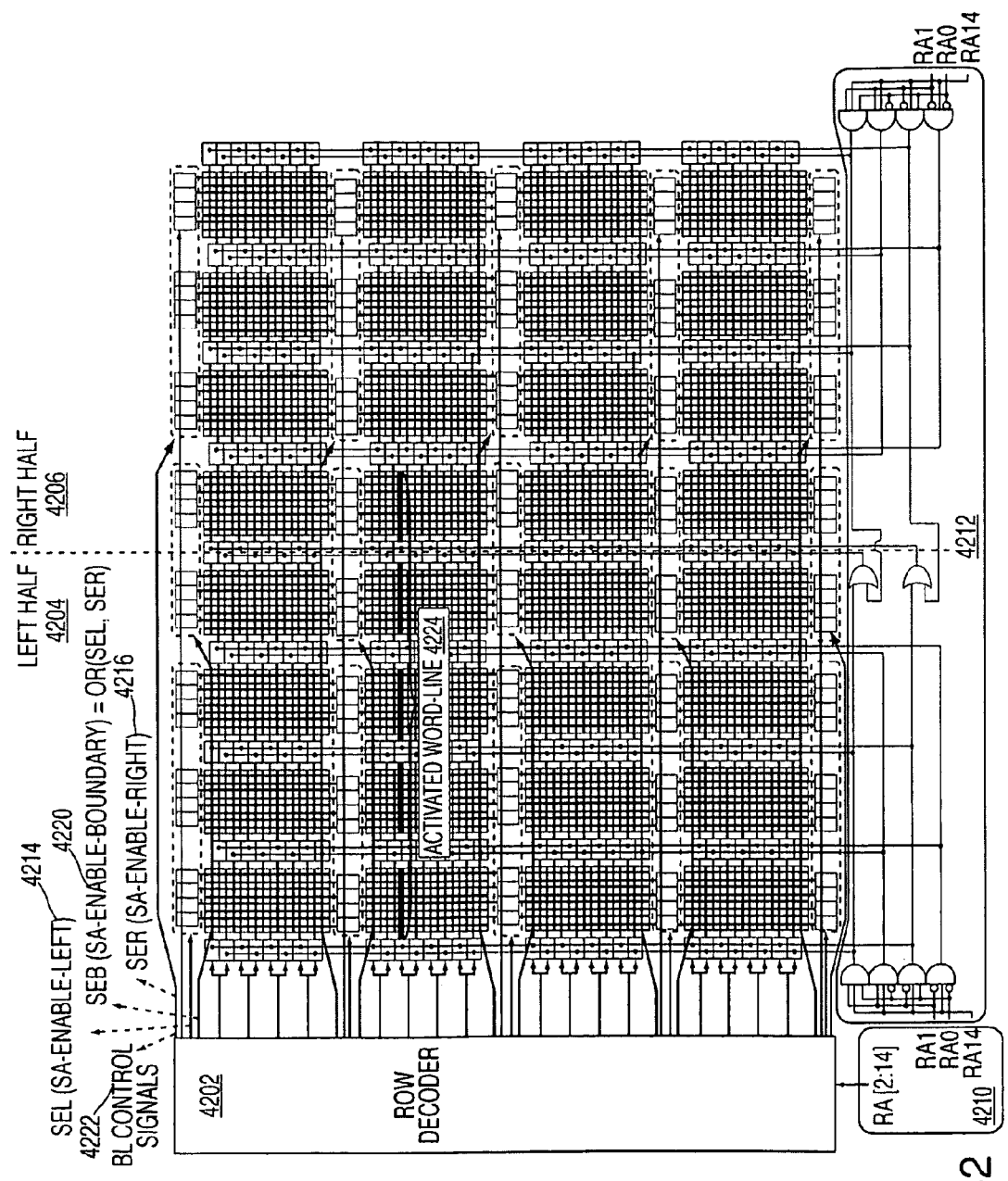
FIG. 42 depicts a detailed view of an array architecture in a memory device that may be implemented by exemplary embodiments.

FIG. 42 depicts details of an alternate exemplary embodiment of a memory device that may be utilized to implement the array depicted in FIG. 39. FIG. 42 depicts a left half of the array 4204, a right half of the array 4206, a row decoder 4202, bit-line control signals 4222, a SEL 4214, a SER 4216, and a row address 4210. As compared to FIG. 41, the embodiment in FIG. 42 does not require an extra set of sub-word line decoders. Instead, the center sub-word line decoders are always operated for both left and right section selection. This makes the length of the activated word-line 4224 slightly longer than half when even word lines (SWL0, 2, 4, . . . ) are selected, but the impact is reduced when the sub-array is 16×16 or 32×32. The amount of power saving gained by cutting the word line (approximately) in half exceeds the amount of extra power consumed by the slightly longer word line. Similarly, with regard to the SAs, the SAs at the two boundary block are always activated. Therefore, there is an additional SA signal, SE boundary (SEB) 4220 which always activates the SAs at the two boundary blocks (e.g. required because the cell is isolated from the bit-lines).

Figure 43:
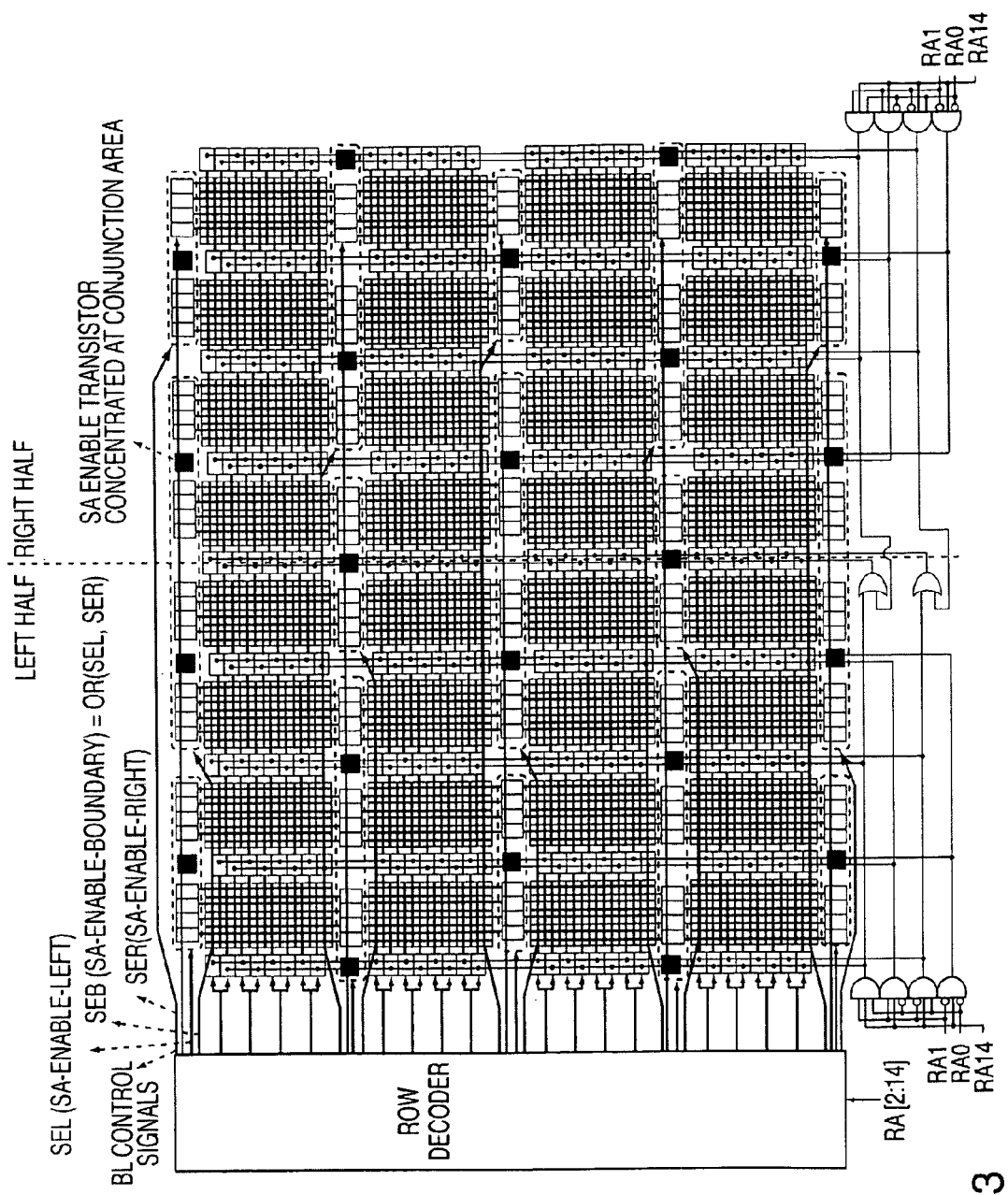
FIG. 43 depicts a detailed view of an array architecture in a memory device that may be implemented by exemplary embodiments.
Figure 44:
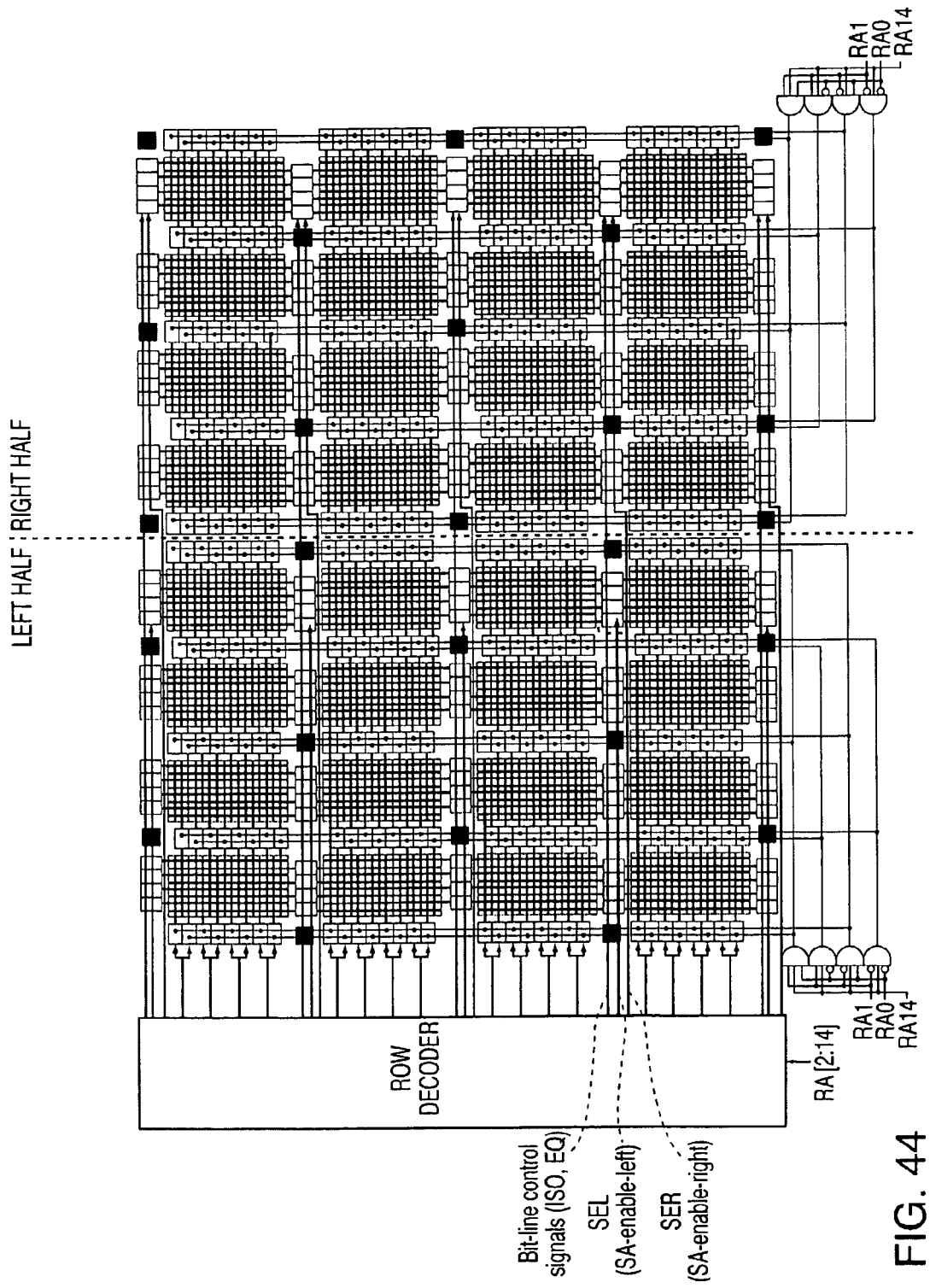
FIG. 44 depicts a detailed view of an array architecture in a memory device that may be implemented by exemplary embodiments.

FIG. 43 depicts a memory device may be implemented by an exemplary embodiment that is similar to the memory device depicted in FIG. 44 except for the grouping of the SAs and the identification of a SA enable transistor at a conjunction area. In most cases, SAs activating transistors (those transistors that connect SA common source nodes to either power or ground) are concentrated into conjunction areas to fully utilize the conjunction space. In this case, the SA activation control granularity becomes two sub-blocks, like WLD activation control granularity. But, those SAs that are connected to activated cells (or word-lines) should be always activated to avoid data loss. Therefore, the number of SAs should be always equal to or greater than the number of activated cells connected to the activated word-line. So, in the case as depicted in FIG. 43, more SAs are activated (when compared to the number of SAs activated in FIG. 42).

FIG. 44 depicts a memory device may be implemented by an exemplary embodiment that is similar to the memory device depicted in FIG. 41 with the addition of concentrated SA enable transistors.

Figure 45:
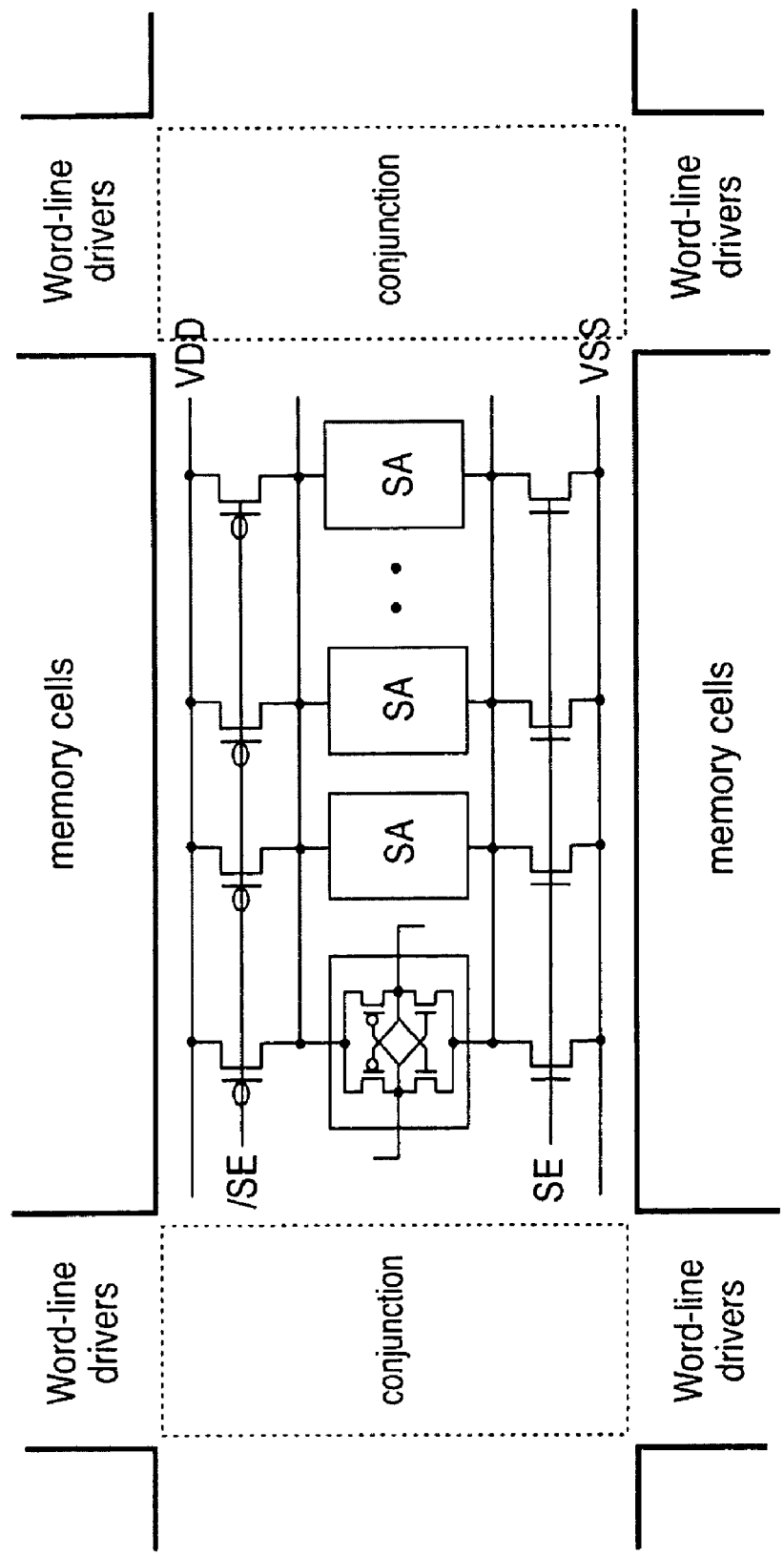
FIG. 45 depicts distributed sense amplifier (SA) enable transistors that may be implemented by exemplary embodiments.
Figure 46:
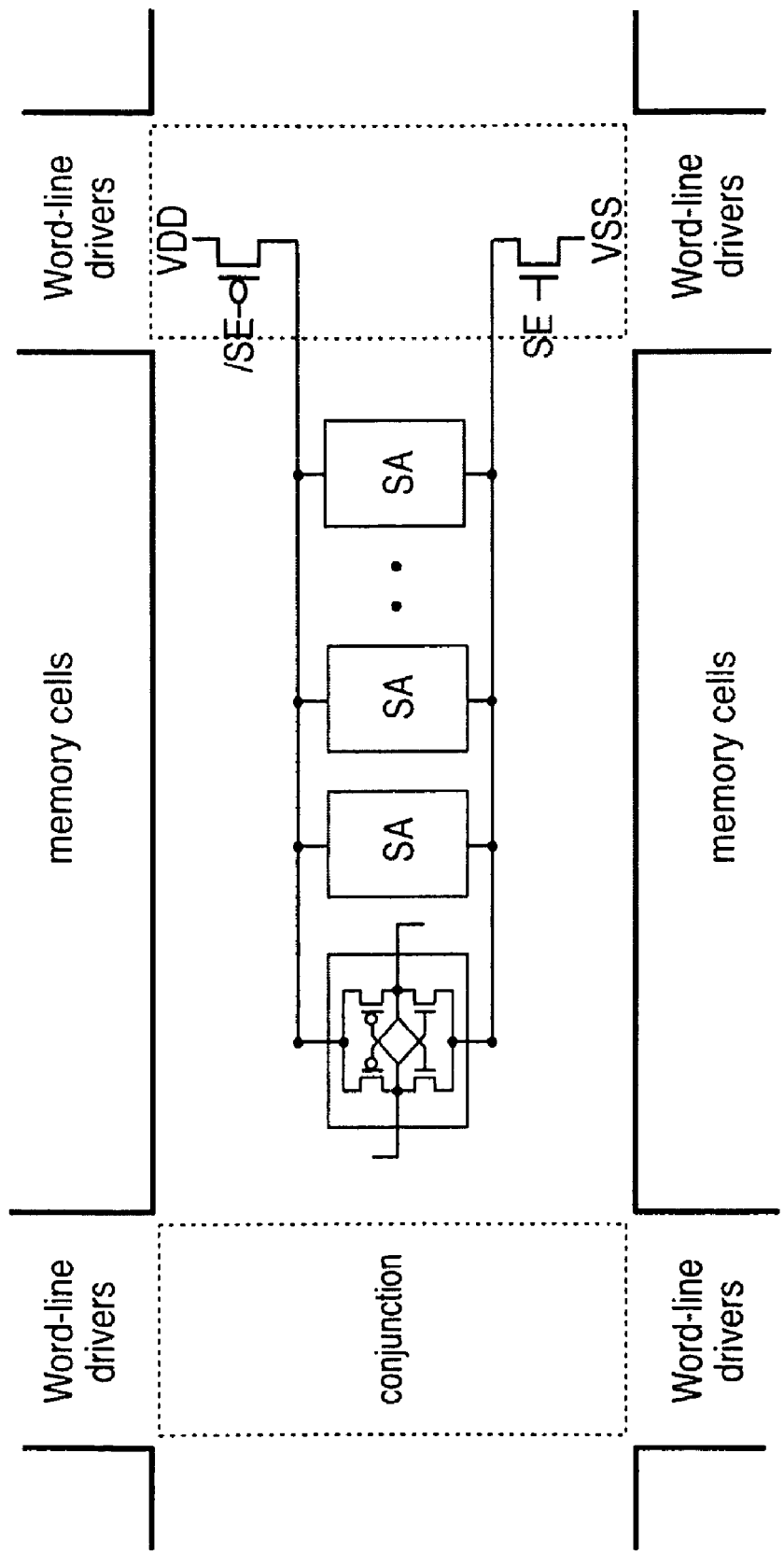
FIG. 46 depicts concentrated SA enable transistors that may be implemented by exemplary embodiments.

FIG. 45 depicts a distributed SA enable transistor enable scheme that may be utilized by memory devices implementing exemplary embodiments of the present invention. FIG. 46 depicts a concentrated SA enable transistor enable scheme that may be utilized by memory devices implementing exemplary embodiments of the present invention. Many contemporary memory device designs implement a mixed scheme that includes both schemes.

Figure 47:
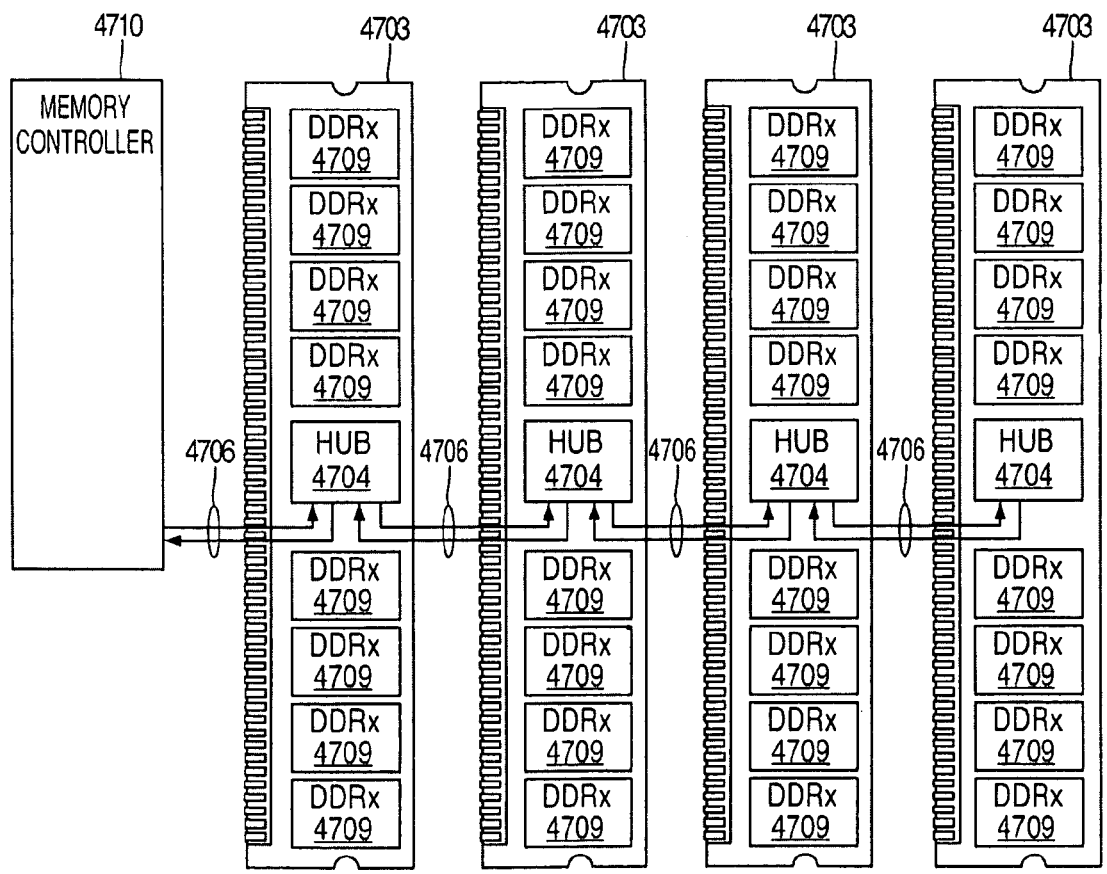
FIG. 47 depicts a memory system that may be implemented by exemplary embodiments.

FIG. 47 depicts a memory system with cascade-interconnected buffered memory modules 4703 and unidirectional buses 4706 that may be implemented by an exemplary embodiment. Although only a single channel is shown on the memory controller, most controllers will include additional memory channel(s), with those channels also connected or not connected to one or more buffered memory modules in a given memory system/configuration. One of the functions provided by the hub devices 4704 on the memory modules 4703 in the cascade structure is a cascade-interconnect (e.g. re-drive and/or re-sync and re-drive) function which, in exemplary embodiments, is programmable to send or not send signals on the unidirectional buses 4706 to other memory modules 4703 or to the memory controller 4710. The final module in the cascade interconnect communication system does not include unidirectional buses 4706 for connection to further buffered memory modules, although in the exemplary embodiment, such buses are present but powered-down to reduce system power consumption. FIG. 47 includes the memory controller 4710 and four memory modules 4703, each module connected to one or more memory buses 4706 (with each bus 4706 comprising a downstream memory bus and an upstream memory bus), connected to the memory controller 4710 in either a direct or cascaded manner. The memory module 4703 next to the memory controller 4710 is connected to the memory controller 4710 in a direct manner. The other memory modules 4703 are connected to the memory controller 4710 in a cascaded manner (e.g. via a hub or buffer device). Each memory module 4703 may include one or more ranks of memory devices 4709, such as exemplary memory devices having reduced power and improved performance.

In an exemplary embodiment, the speed of the memory buses 4706 is a multiple of the speed of the memory module data rate (e.g. the bus(es) that communicate such information as address, control and data between the hub, buffer and/or register device(s) and the memory devices), operating at a higher speed than the memory device interface(s). Although not shown, the memory devices may include additional signals (such as reset and error reporting) which may communicate with the buffer device 4704 and/or with other devices on the module or external to the module by way of one or more other signals and/or bus(es). For example, the high-speed memory data bus(es) 4706 may transfer information at a rate that is four times faster than the memory module data rate (e.g. the data rate of the interface between the buffer device and the memory devices). In addition, in exemplary embodiments the signals received on the memory buses 4706 are in a packetized format and it may require several transfers (e.g., four, five, six or eight) to receive a packet. For packets intended for a given memory module, the signals received in the packetized memory interface format are converted into a memory module interface format by the hub devices 4704 once sufficient information transfers are received to permit communication with the memory device(s). In exemplary embodiments, a packet may comprise one or more memory device operations and less than a full packet may be needed to initiate a first memory operation. In an exemplary embodiment, the memory module interface format is a serialized format. In addition, the signals received in the packetized memory interface format are re-driven on the high speed memory buses (e.g., after error checking and re-routing of any signals (e.g. by use of bitlane sparing between any two devices in the cascade interconnect bus) has been completed).

In the exemplary embodiment, the unidirectional buses 4706 include an upstream bus and a downstream bus each with full differential signaling. As described previously, the downstream bus from the memory controller 4710 to the hub device 4704 includes sixteen differential signal pairs made up of thirteen active logical signals, two spare lanes, and a bus clock. The upstream bus from the hub device 4704 to the memory controller 4710 includes twenty-three differential signal pairs made up of twenty active logical signals, two spare lanes, and a bus clock.

Memory devices are generally defined as integrated circuits that are comprised primarily of memory (storage) cells, such as DRAMs (Dynamic Random Access Memories), SRAMs (Static Random Access Memories), FeRAIVIs (Ferro-Electric RAMs), MRAIVIs (Magnetic Random Access Memories), ORAMs (optical random access memories), Flash Memories and other forms of random access and/or pseudo random access storage devices that store information in the form of electrical, optical, magnetic, biological or other means. Dynamic memory device types may include asynchronous memory devices such as FPM DRAMs (Fast Page Mode Dynamic Random Access Memories), EDO (Extended Data Out) DRAMs, BEDO (Burst EDO) DRAMs, SDR (Single Data Rate) Synchronous DRAMs, DDR (Double Data Rate) Synchronous DRAMs, QDR (Quad Data Rate) Synchronous DRAMs, Toggle-mode DRAMs or any of the expected follow-on devices such as DDR2, DDR3, DDR4 and related technologies such as Graphics RAMs, Video RAMs, LP RAMs (Low Power DRAMs) which are often based on at least a subset of the fundamental functions, features and/or interfaces found on related DRAMs.

Memory devices may be utilized in the form of chips (die) and/or single or multi-chip packages of various types and configurations. In multi-chip packages, the memory devices may be packaged with other device types such as other memory devices, logic chips, analog devices and programmable devices, and may also include passive devices such as resistors, capacitors and inductors. These packages may include an integrated heat sink or other cooling enhancements, which may be further attached to the immediate carrier or another nearby carrier or heat removal system.

The capabilities of the present invention can be implemented in software, firmware, hardware or some combination thereof.

As will be appreciated by one skilled in the art, the present invention may be embodied as a device, a sub-system, a system, method or computer program product. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product embodied in any tangible medium of expression having computer usable program code embodied in the medium.

Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, etc.

Computer program code for carrying out operations of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The present invention is described with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated. Moreover, the use of the terms first, second, etc. do not denote any order or importance, but rather the terms first, second, etc. are used to distinguish one element from another.

The invention claimed is:

1. A memory device comprising:
   a memory array storing data;
   a variable delay controller periodically receiving delay commands from a first source external to the memory device during operation of the memory device, and outputting delay instruction bits responsive to the received delay commands;
   a passive variable delay circuit:
      receiving a clock from a second source external to the memory device;
      receiving the delay instruction bits from the variable delay controller;
      generating a delayed clock having a time relation to the received clock as determined by the delay instruction bits; and
      outputting the delayed clock; an output driver:
      receiving the data from the memory array and the delayed clock;
      outputting the data at a time responsive to the delayed clock; and
   a clock enable (CKE) pin, wherein the memory device transitions from a power down state to a calibration state in response to a serial pattern received on the CKE pin.

2. The memory device of claim 1 wherein the first source external to the memory device is a memory controller and the second source external to the memory device is the memory controller.

3. The memory device of claim 1 wherein the first source external to the memory device is a hub device and the second source external to the memory device is the hub device.

4. The memory device of claim 1 wherein the variable delay controller is an up/down counter and the delay instruction bits specify an amount of time to add or subtract from a previous delayed clock to generate the delayed clock.

5. The memory device of claim 1 wherein the variable delay controller is a mode register and the delay instruction bits specify a specific delay to apply to the received clock to generate the delayed clock.

6. The memory device of claim 1 wherein the delay command is a mode register set (MRS) command.

* * * * *